(12) United States Patent
Dahl et al.

(10) Patent No.: US 7,521,733 B2
(45) Date of Patent: Apr. 21, 2009

(54) METHOD FOR MANUFACTURING AN INTEGRATED CIRCUIT AND INTEGRATED CIRCUIT WITH A BIPOLAR TRANSISTOR AND A HETERO BIPOLAR TRANSISTOR

(75) Inventors: Claus Dahl, Dresden (DE); Karl-Heinz Mueller, Velden (DE); Cajetan Wagner, Dresden (DE)

(73) Assignee: Infineon Technologies AG, Munich (DE)

( * ) Notice: Subject to any disclaimer, the term of this patent is extended or adjusted under 35 U.S.C. 154(b) by 263 days.

(21) Appl. No.: 10/987,952

(22) Filed: Nov. 12, 2004

(65) Prior Publication Data

US 2005/0156193 A1    Jul. 21, 2005

Related U.S. Application Data

(63) Continuation of application No. PCT/EP03/05001, filed on May 13, 2003.

(30) Foreign Application Priority Data

May 14, 2002    (DE)    ................................ 102 21 416

(51) Int. Cl.
   *H01L 29/737*    (2006.01)
(52) U.S. Cl. ............... 257/195; 257/553; 257/E27.056; 257/198
(58) Field of Classification Search ................. 257/533, 257/553, 560, 563, 564, 566, 195
   See application file for complete search history.

(56) References Cited

U.S. PATENT DOCUMENTS

| | | | | |
|---|---|---|---|---|
| 5,436,475 A | * | 7/1995 | Tews et al. | .................... 257/197 |
| 5,508,553 A | * | 4/1996 | Nakamura et al. | .......... 257/576 |
| 5,523,606 A | | 6/1996 | Yamazaki | |
| 5,858,850 A | * | 1/1999 | Gomi | .......................... 438/314 |
| 5,915,186 A | | 6/1999 | Gomi | |
| 5,930,635 A | * | 7/1999 | Bashir et al. | ................. 438/313 |
| 6,169,007 B1 | | 1/2001 | Pinter | |
| 6,436,781 B2 | * | 8/2002 | Sato | ............................ 438/350 |
| 6,455,364 B1 | * | 9/2002 | Asai et al. | .................... 438/235 |
| 2001/0008298 A1 | | 7/2001 | Sato | |

(Continued)

FOREIGN PATENT DOCUMENTS

DE    197 57 685 A1    7/1998

(Continued)

*Primary Examiner*—Jerome Jackson, Jr.
(74) *Attorney, Agent, or Firm*—Maginot, Moore & Beck

(57) ABSTRACT

For the integration of an npn bipolar transistor with a hetero bipolar transistor, a placeholder layer is generated in a base region of the hetero bipolar transistor after structuring a collector structure for both types of transistors, wherein the placeholder layer is not present in a base region of the bipolar transistor. After generating the base of the bipolar transistor, the base of the bipolar transistor is covered, whereupon the placeholder layer is removed and the base of the hetero bipolar transistor is generated in the places where the placeholder layer has been removed. The emitter structure is again generated equally for both types of transistors so that an integrated circuit results which includes bipolar transistors and hetero bipolar transistors whose collector structures and/or whose emitter structures consist of identical production layers. Thus, space-saving and cost-effective integrated circuits may be produced benefiting from the advantages of both types of transistors.

6 Claims, 27 Drawing Sheets

U.S. PATENT DOCUMENTS

2001/0045604 A1* 11/2001 Oda et al. .................. 257/350
2003/0025114 A1* 2/2003 Yamauchi ................... 257/19
2003/0160301 A1* 8/2003 Furukawa et al. ........... 257/539

FOREIGN PATENT DOCUMENTS

| EP | 1 117 133 A1 | 7/2001 |
| GB | 2 362 508 A | 11/2001 |

* cited by examiner

METHOD FOR MANUFACTURING AN INTEGRATED CIRCUIT AND INTEGRATED CIRCUIT WITH A BIPOLAR TRANSISTOR AND A HETERO BIPOLAR TRANSISTOR

CROSS-REFERENCE TO RELATED APPLICATION

This application is a continuation of copending International Application No. PCT/EP03/05001, filed on May 13, 2003, which designated the United States and was not published in English.

BACKGROUND OF THE INVENTION

1. Field of the Invention

The present invention relates to integrated circuits and particularly to an integrated circuit including a bipolar transistor and a hetero bipolar transistor.

2. Description of the Related Art

Bipolar transistors, i.e. transistors made of semiconductor material homogeneous with respect to the material, are known and include a collector, a base, and an emitter. In the case of an npn transistor, the collector is formed of an n-doped semiconductor material, the base is formed of a p-doped semiconductor material, and the emitter is formed of an n-doped semiconductor material.

A species of such an npn bipolar transistor (BT) is the so-called double poly-silicon bipolar transistor in self-aligning technology.

What is further known in the art is the hetero bipolar transistor (HBT), which is more critical in the technological production than the conventional bipolar transistor. A hetero bipolar transistor is also an npn or pnp structure, the base material, however, being a semiconductor material other than the material of the emitter and the collector. If, for example, a SiGe hetero bipolar transistor is mentioned, this usually means that the substrate, the collector and the emitter of the HBT are formed of silicon, while the base is formed of silicon germanium. An example for a silicon-germanium hetero bipolar transistor (HBT) is the double poly SiGe HBT in self-aligning technology with selectively epitaxially grown base.

What is further known in the art is the so-called BiCMOS technology, in which, on an integrated circuit, conventional bipolar transistors are integrated with CMOS inverters, wherein a CMOS inverter consists of an n-channel FET and a p-channel FET.

Classic bipolar transistors show a good yield in the production, i.e. the production or manufacturing steps for classic bipolar transistors are controlled well. The disadvantage of classic bipolar transistors compared to hetero bipolar transistors is the fact that they produce more noise than hetero bipolar transistors and that they have lower cut-off frequencies. Particularly for low-noise high-frequency applications, a hetero bipolar transistor is therefore preferred to a normal bipolar transistor.

On the other hand, a classic bipolar transistor has a good matching behavior due to the well-controllable technology. If, for example, a current mirror is to be constructed of transistors, two transistors should be as identical as possible, i.e. adapted or matched well to each other. In other words, the matching behavior of these two transistors should be as high as possible. It is known from the integrated circuit technology that, in the case of a less favorable matching behavior, as it occurs in hetero bipolar transistors, this less favorable matching behavior may be compensated by increasing the overall size of the transistors, which results in a higher chip area consumption. Expressed in other words, circuits of bipolar transistors can therefore be integrated smaller and saving more chip area. What is more important, however, is the disadvantage of the HBP that the yield, i.e. the number of functional transistors per waver, is significantly reduced compared to the yield with classic bipolar transistors.

Particularly with transmit/receive modules for portable telephones for other radio applications, there need to be especially low-noise and fast transistors at certain locations, such as in the first stage of the HF input amplifier. On the other hand, the noise property of the transistor will not be so important at other locations in this integrated transmitter/receive module, but rather the requirement that several transistors may be designed as identical as possible, such as in a symmetrical mixer for down-mixing the HF receive signal into the baseband. In addition, speed and/or cut-off frequency of the transistor are not of substantial importance in the baseband. What is of more importance here is a reliable characteristic for the behavior of the transistor and also, of course, the chip area consumption and, last but not least, the costs.

The costs for a single module, however, increase with decreasing yield, so that a production of a transmit/receive module using classic bipolar transistors alone may have good yield and a low chip area consumption, but falls behind with respect to cut-off frequency and noise behavior compared to a complete implementation of the module with HBTs, while the HBT integration causes higher chip area consumption and lower yield, i.e. higher costs.

SUMMARY OF THE INVENTION

It is the object of the present invention to provide a cost-effective integrated circuit with good electric characteristics and a method for producing the integrated circuit.

In accordance with a first aspect, the present intention provides a method for producing an integrated circuit hating a bipolar transistor with a base of a first semiconductor material and a hetero bipolar transistor with a base of a second semiconductor material, the method having the steps of structuring a semiconductor substrate of a first semiconductor material to generate collector structures for the bipolar transistor and the hetero bipolar transistor; generating a placeholder layer in a base region of the hetero bipolar transistor, wherein the placeholder layer is not present in a base region of the bipolar transistor; generating a base of the bipolar transistor, wherein the placeholder layer is present in the base region of the hetero bipolar transistor, by generating emitter structures for the hetero bipolar transistor and the bipolar transistor, wherein the emitter window for the hetero bipolar transistor extends as far as the placeholder layer, and wherein the emitter window for the bipolar transistor extends as far as the collector structure; and implantation on the collector structure of the bipolar transistor and the placeholder layer through the emitter windows, wherein the implantation is adjusted so that the placeholder layer is substantially not penetrated by an implantation material, and wherein the implantation is an implantation according to a second doping type which differs from a first doping type with which the collector structure is doped; after the step of generating the base of the bipolar transistor, implanting on the collector structure of the bipolar transistor and the placeholder layer through the emitter windows, wherein the step of implanting is adjusted so that the placeholder layer is penetrated by an implantation material, and wherein the implantation is an implantation according to the first doping type; after the step of implanting, covering the base of the bipolar transistor and removing the placeholder layer; generating the base of the hetero bipolar transistor of the second semiconductor material in a region from which the placeholder layer has been removed; and generating emitter structures for the bipolar transistor and the hetero bipolar transistor.

In accordance with a second aspect, the present invention provides an integrated circuit, having a semiconductor substrate with layers; a bipolar transistor in the semiconductor substrate; and a hetero bipolar transistor in the semiconductor substrate, wherein collector structures of the bipolar transistor and the hetero bipolar transistor and/or emitter structure of the bipolar transistor and the hetero bipolar transistor are formed in different regions of the integrated circuit, of identical layers of the semiconductor substrate, and wherein the collector structures of the bipolar transistor and the hetero bipolar transistor have a buried layer; a collector terminal region; an upper layer which is lower doped than the buried layer, and a region in the upper layer which is higher doped than the upper layer.

The inventive integrated circuit includes a semiconductor substrate, a bipolar transistor in the semiconductor substrate, and a hetero bipolar transistor in the semiconductor substrate, wherein the two transistors are integrated such that as many production steps as possible may be used jointly both for the classic bipolar technology and the hetero bipolar technology. The inventive integrated circuit is characterized in that the collector structures for the bipolar transistor and the hetero bipolar transistor are formed of identical layers of the semiconductor substrate, and/or that the emitter structures of the bipolar transistor and the hetero bipolar transistor are formed of identical layers of the semiconductor substrate.

The common use of the same layers as collector structure for a bipolar transistor on the one hand and a hetero bipolar transistor on the other hand is made possible by a placeholder layer being generated in a base region of the hetero bipolar transistor, wherein the placeholder layer is not present in a base region of the bipolar transistor. Then, the base of the bipolar transistor may be generated without special measures having to be taken for the base region of the hetero bipolar transistor, because the placeholder layer prevents the base region of the hetero bipolar transistor from being influenced by the steps for the production of the base of the bipolar transistor. After the base of the bipolar transistor has been produced, it is covered, wherein the placeholder layer is further removed to generate then the base of the hetero bipolar transistor of the second semiconductor material, such as silicon germanium, in the region from which the placeholder layer has been removed. After the generation of the base preferably generated by selectively epitaxially growing silicon germanium, both the bipolar transistor and the hetero bipolar transistor on the integrated circuit are in the same state, such that the emitter structure for the bipolar transistor and the hetero bipolar transistor may be generated using the same process steps.

The inventive concept is characterized in that as many production steps as possible are the same both for the bipolar transistor and for the hetero bipolar transistor. In particular, both the collector structure and the emitter structure for both transistors may be generated using the same steps.

An advantage of the present invention is that now bipolar transistors may be integrated with HBTs in an integrated circuit in a cost-effective manner. Particularly for applications such as transmit/receive modules, in which characteristics of bipolar transistors and characteristics of hetero bipolar transistors are required at different locations, actually a hetero bipolar transistor may be used only at the location where it is necessarily required, while normal bipolar transistors may be used at other locations.

Overall, the circuit thus has a good electric behavior, because the low noise and the high cut-off frequency of the hetero bipolar transistors may be utilized, while, at the same time, the yield of the circuit is high, because only as few hetero bipolar transistors as possible are used so that the overall yield may be kept high, because the yield would decrease with an increasing number of hetero bipolar transistors on a circuit. On the other hand, chip area may be saved, because the good matching properties of the normal bipolar transistors may be utilized, namely also in those places in the circuit where it is actually necessary.

The inventive concept of the integration of bipolar transistors and hetero bipolar transistors in an integrated circuit, wherein both types of transistors are equal in their collector structure and/or their emitter structure, which is made possible by using the placeholder layer, may thus, on the one hand, generate a cost-effective circuit, which, on the other hand, has favorable electric properties dominated by the yield-critical and chip area-intensive hetero bipolar transistors where it is actually necessary. A further advantage of the present invention is that the integration concept for integrating bipolar transistors and hetero bipolar transistors is compatible with a CMOS process concept so that CMOS circuits may further be additionally integrated on the integrated circuit.

BRIEF DESCRIPTION OF THE DRAWINGS

Preferred embodiments of the present invention are explained in detail in the following with respect to the accompanying drawings, in which.

DESCRIPTION OF THE PREFERRED EMBODIMENTS

Figure 26:
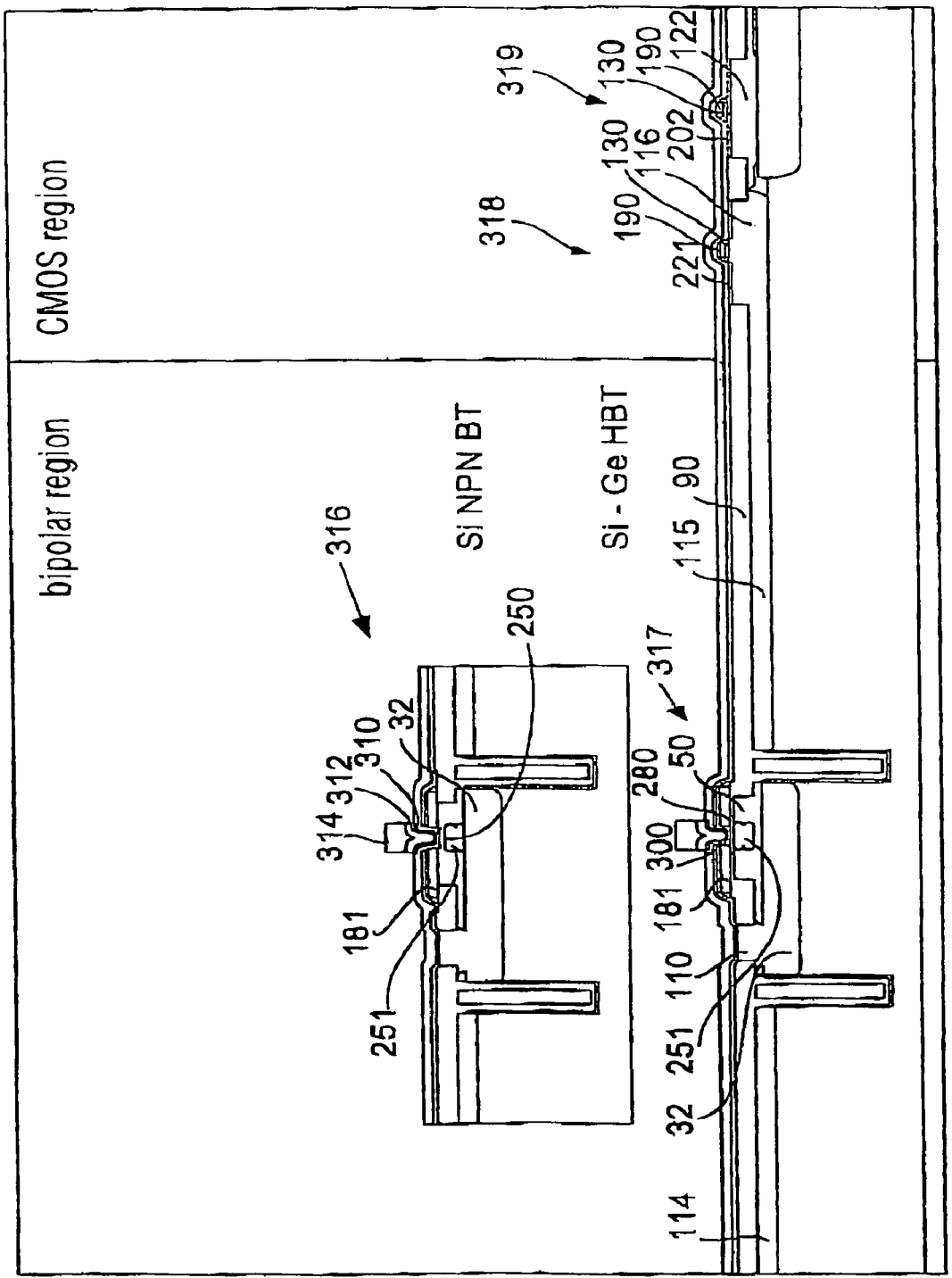
FIG. 26 shows a cross-section through an integrated circuit after a lithography step for defining the emitter region both for the bipolar transistor and for the hetero bipolar transistor.
Figure 27:
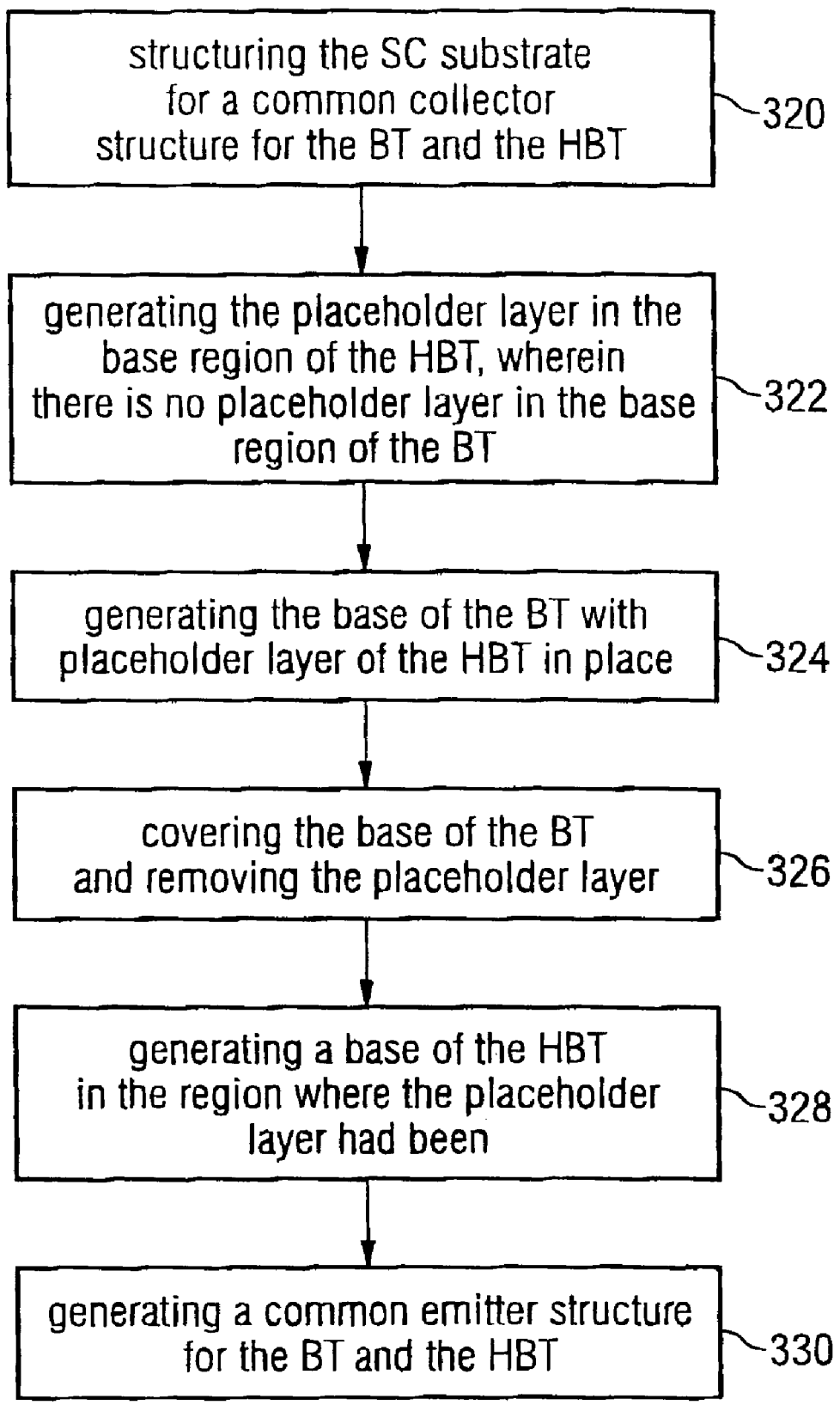
FIG. 27 shows a flow diagram of the basic steps for the inventive production of an integrated circuit including classic bipolar transistors and hetero bipolar transistors.

Before the detailed process sequence for producing an inventive integrated circuit in accordance with a preferred embodiment, illustrated in FIGS. 1 to 26, is discussed in the following, the basic concept on which the present invention is based is explained with respect to FIG. 27. First, a semiconductor substrate for a common collector structure both for the bipolar transistor and the hetero bipolar transistor is structured (320). Next, the placeholder layer is generated in the base region of the hetero bipolar transistor, wherein, however, no placeholder layer is present in the base region of the bipolar transistor (322). Now, the base of the bipolar transistor and the collector of bipolar and hetero bipolar transistors are generated preferably by implanting and annealing with the placeholder layer of the hetero bipolar transistor in place.

The placeholder layer ensures that the implantation atoms of the base implantation shot onto the integrated circuit do not penetrate the semiconductor region below the placeholder layer, but are accommodated by the same. The collector implantation penetrates the placeholder layer and becomes operative both for the bipolar transistor and for the hetero bipolar transistor. This has the advantage that no extra measures have to be taken for the hetero bipolar transistors, but that simply the entire integrated circuit, i.e. the entire waver, may be subjected to the implantation steps, wherein an effective semiconductor implantation with the dopant of the base implantation only occurs in the base regions of the bipolar transistors, but not in the base regions of the hetero bipolar transistors, which is to be attributed to the placeholder layer.

In a step 326, the base of the bipolar transistor is then covered, wherein the placeholder layer is further removed from the base region of the hetero bipolar transistor to generate, in a later step 328, the base of the hetero bipolar transistor in the region where the placeholder layer had been, preferably by means of selective epitaxy from, for example, SiGe to Si, wherein, however, no growing occurs in the base region of the bipolar transistor, which is to be attributed to the cover, which is preferably implemented as nitride layer (260 in FIG. 22). This nitride layer is the nitride layer with which the sidewall spacers in the HBT are generated and which was covered on the rest of the waver by means of lithography and therefore was not etched there (cf. FIG. 21 and FIG. 22). In the bipolar transistor, there is still the thin scattering oxide of the base implantation below this nitride.

After removing the cover of the base of the bipolar transistor, i.e. the nitride layer, the base regions of both the bipolar transistor and the hetero bipolar transistor are exposed and may be processed further with the same steps according to the invention to finish the individual transistors by producing respective emitter structures identical for both types of transistors (step 330).

Before the individual figures are discussed in detail in the following, it is to be noted that each figure of FIGS. 1 to 26 compares the bipolar region with a CMOS region. From this comparison, it becomes apparent that many steps may be used jointly both for the bipolar region and for the CMOS region.

Figure 14:
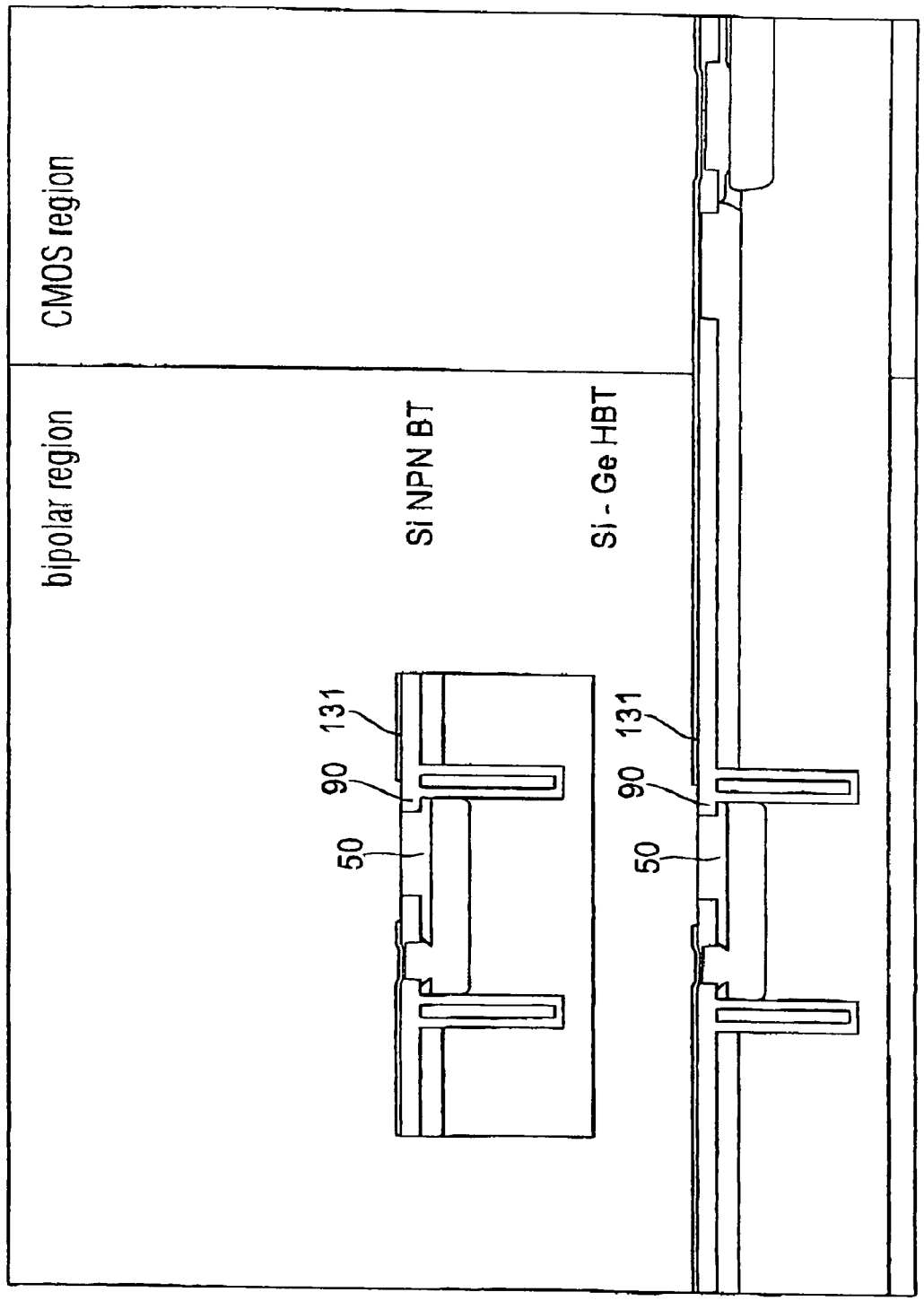
FIG. 14 shows a cross-section through an integrated circuit after opening the base region of both the npn bipolar transistor and the hetero bipolar transistor.
Figure 15:
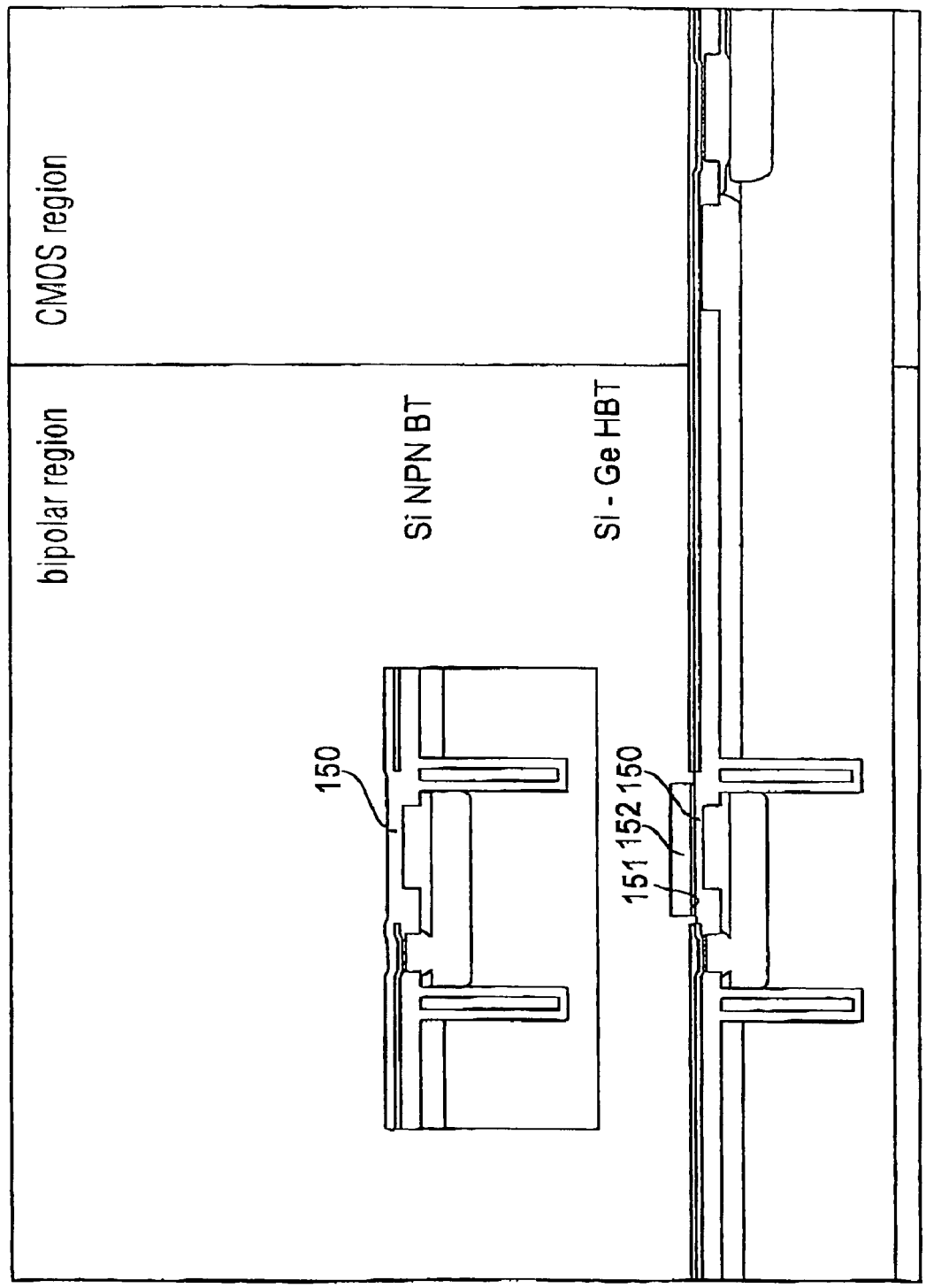
FIG. 15 shows a cross-section through an integrated circuit after a lithography step for defining the placeholder layer in the base region of the HBT.
Figure 19:
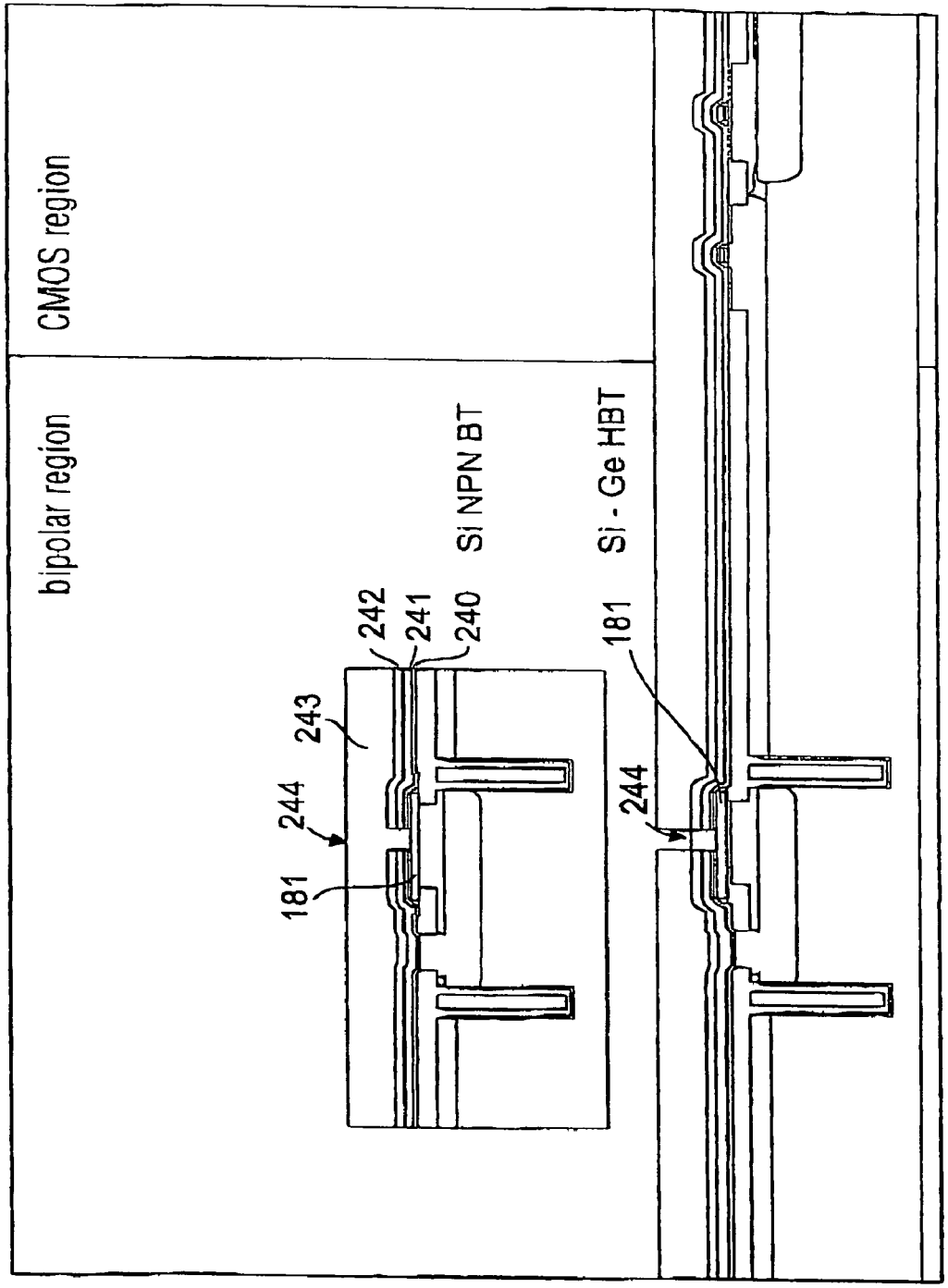
FIG. 19 shows a cross-section through an integrated circuit after a lithography step for defining emitter windows in the bipolar region.
Figure 20:
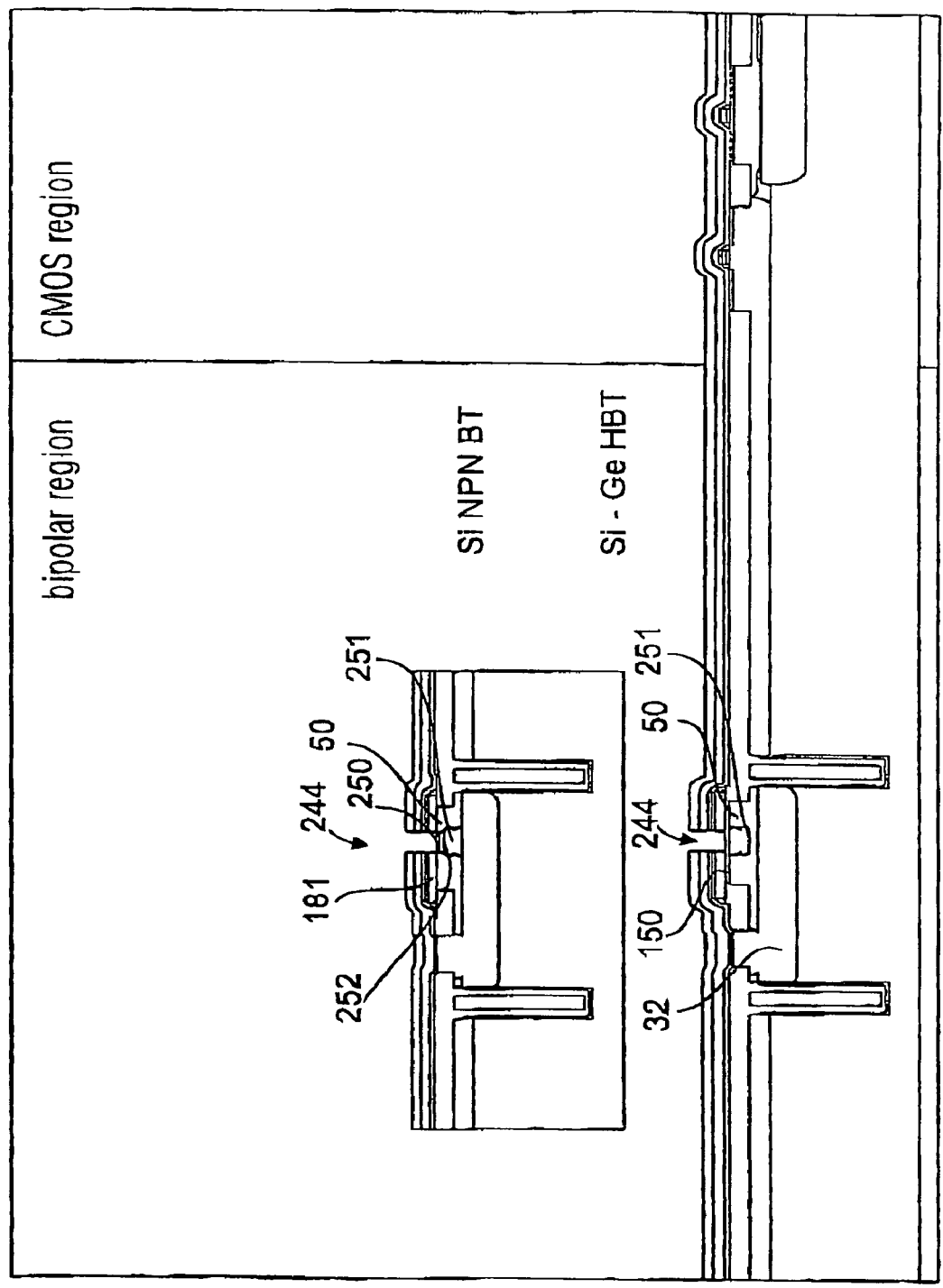
FIG. 20 shows cross-section through an integrated circuit after producing selectively implanted collectors in the bipolar region and after producing the base of the npn bipolar transistor.

In FIGS. 1 to 14, the inventive concept shows no difference with respect to the hetero bipolar transistor or the classic npn transistor. In FIG. 15, the generation of the placeholder layer is illustrated. In the following FIGS. 16 to 20, both the npn transistor (BT) and the Si—Ge HBT are treated in the same manner, wherein, however, the base implantation shown in FIG. 20 is not successful in the base region of the HBT due to the placeholder layer. Only in FIGS. 21 to 23, a distinction is made again between the processing of the bipolar transistor and the HBT, wherein this distinction occurs due to the fact that the placeholder layer is removed to insert the base of the HBT into the region in which the placeholder layer had been present. In the state of the production of the integrated circuit illustrated in FIG. 23, both types of transistors are again "synchronous", so that finishing the emitter structure, as illustrated in FIGS. 24 to 26, may again be performed identically for both transistors without there being necessary integration steps which, for example, only involve the npn transistor, but which do not involve the hetero bipolar transistor or vice versa.

In the following, FIGS. 1 to 26 are discussed to present a continuous process chain according to a preferred embodiment of the present invention for producing an integrated circuit with a Si-npn-bipolar transistor, a Si—Ge HBT, and a CMOS structure.

Figure 1:
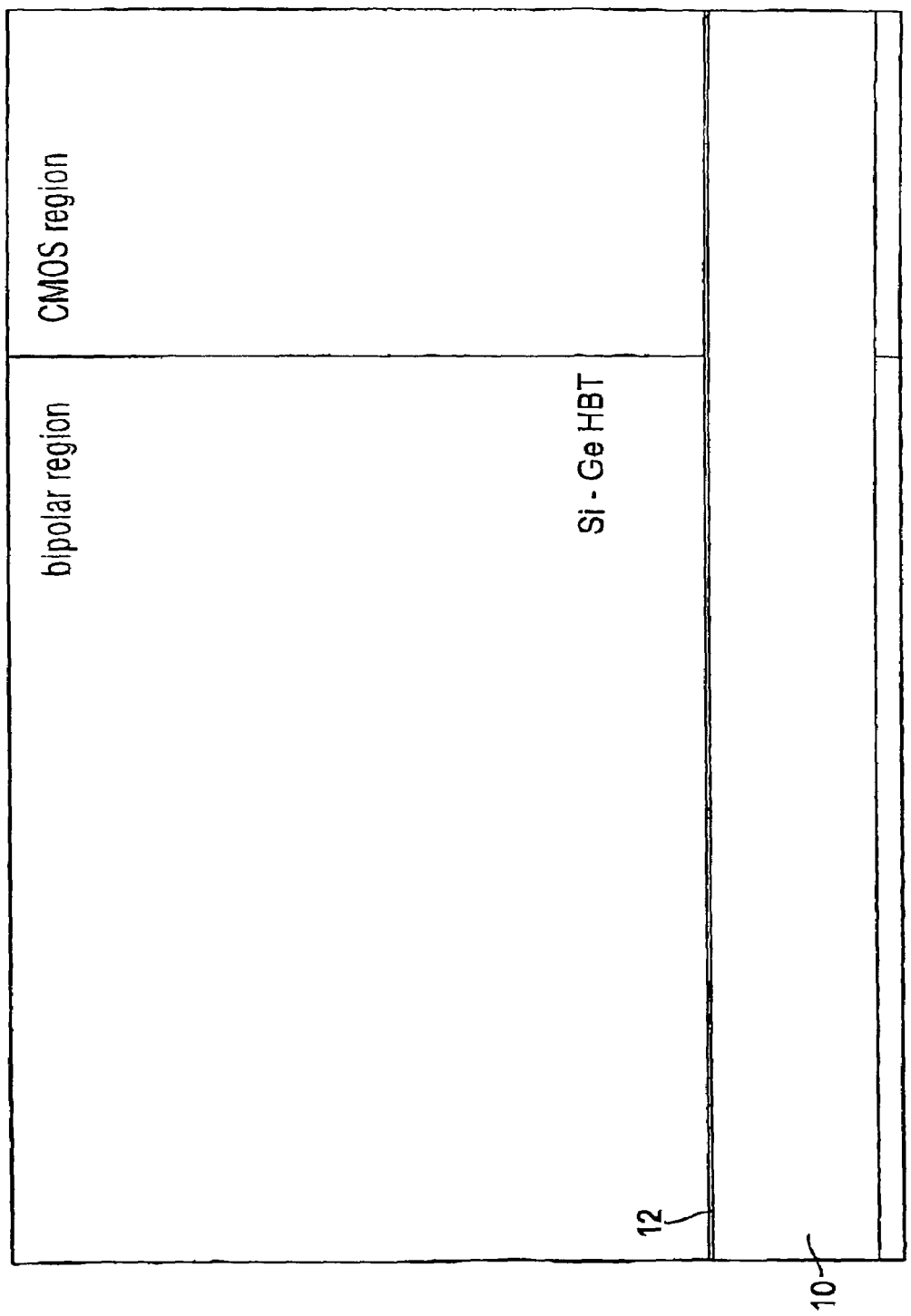
FIG. 1 shows a cross-section through an integrated circuit after a first lithography step for producing alignment marks.

In FIG. 1, an initial substrate is provided first preferably in the form of a p-substrate 10. The substrate is cleaned and then provided with an oxide layer 12. Then, a set of alignment marks is defined in a first lithography step. It is to be noted that formed alignment marks are not shown in FIG. 1.

Figure 2:
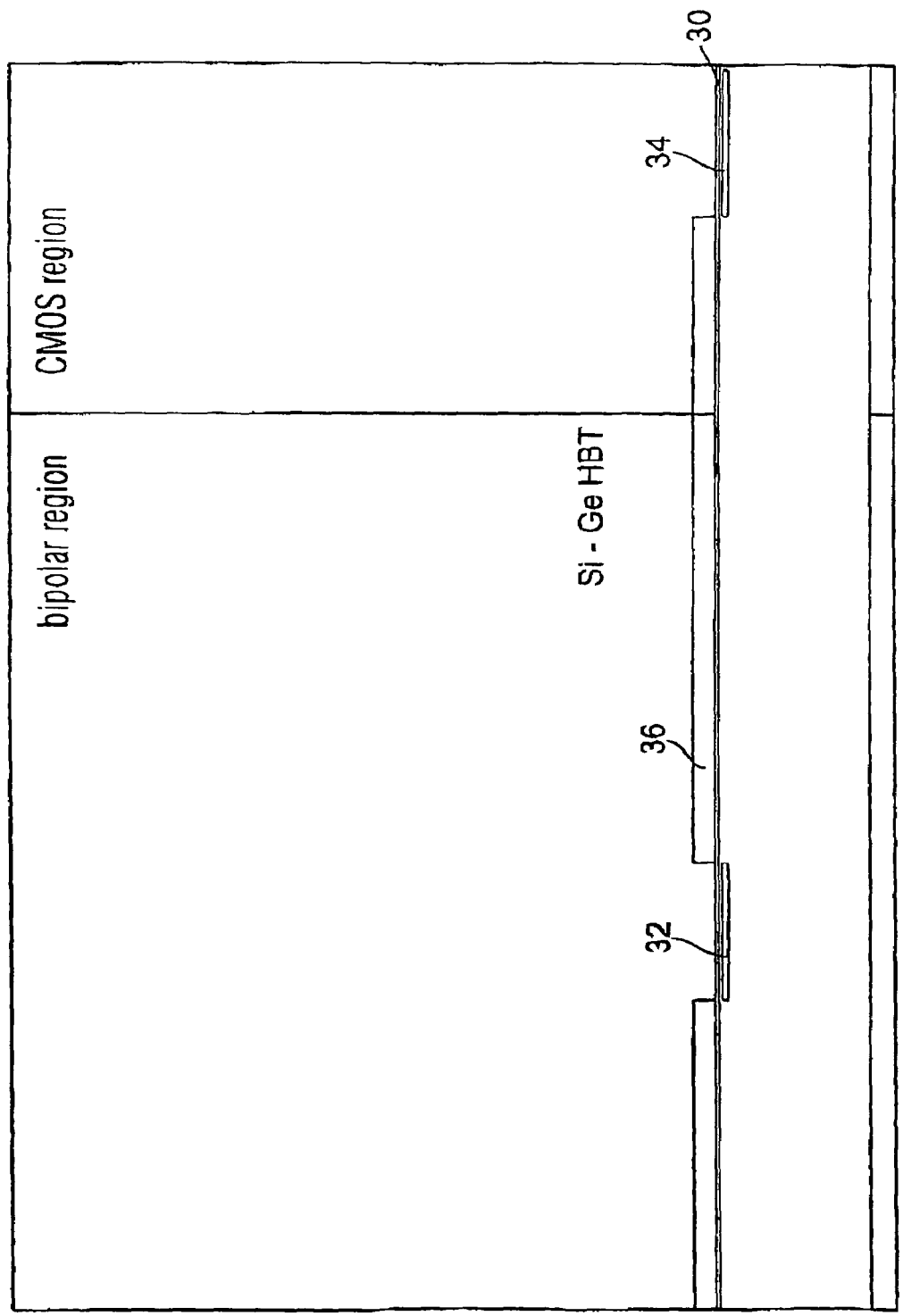
FIG. 2 shows a cross-section through an integrated circuit after a lithography step for implanting a buried N layer both in the bipolar region and in the CMOS region.

In FIG. 2, wet etching is then performed to completely remove the oxide layer 12 shown in FIG. 1. Then another oxidation is performed to generate another oxidation layer 30 preferably having a thickness of 15 nm. Then, a further lithography step is performed to define regions of a buried layer 32 in the bipolar region and 34 in the CMOS region. The regions 32 and 34 are defined by a corresponding photo-resist 36 applied by the lithography step. An arsenic implantation with a dosage of some $10^{15}$ cm$^{-2}$ then lays the foundations, so to speak, for the buried layer 32 in the bipolar region, which later on will be part of the collector structure.

Figure 3:
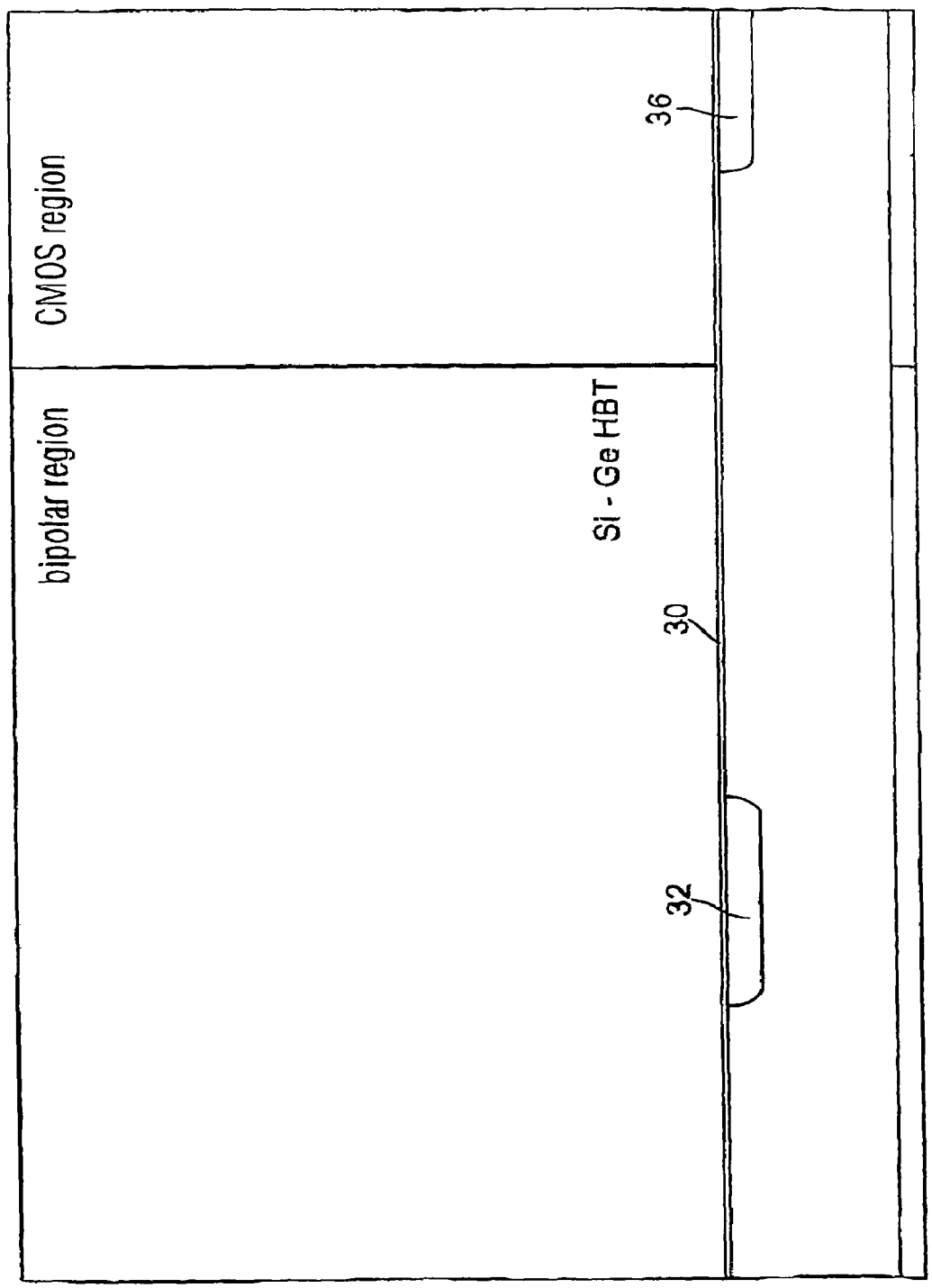
FIG. 3 shows a cross-section through an integrated circuit after an outdiffusion of the implantation regions.
Figure 4:
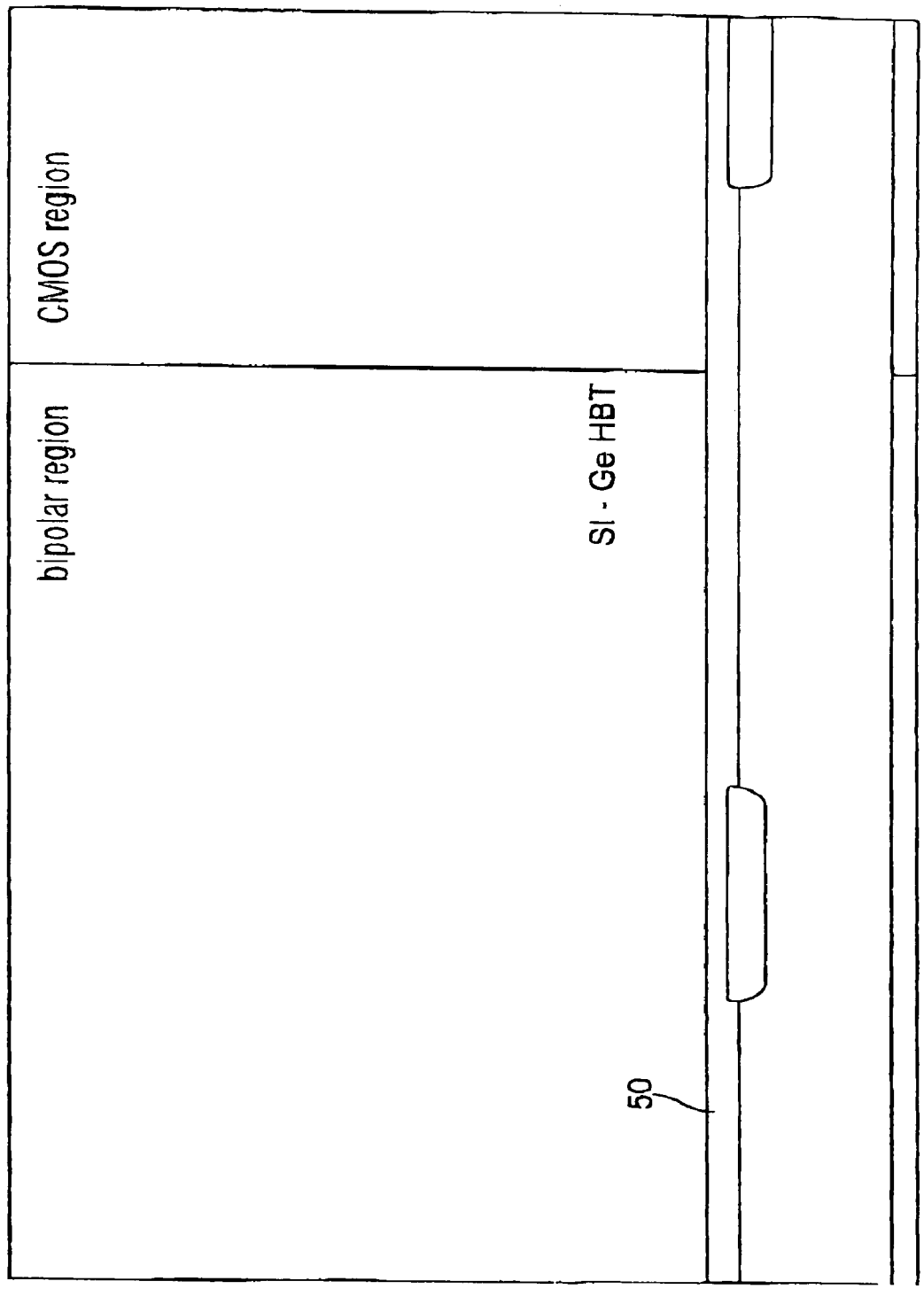
FIG. 4 shows a cross-section through an integrated circuit after an epitaxial step.

FIG. 3 shows a cross-section through the integrated circuit after the photo-resist 36 has been removed and after the implantation regions 32 and 34 of FIG. 2 have been in-diffused by a temperature treatment.

In a next step, the oxide layer 30 is then removed by wet etching. After that, a silicon layer 50 slightly n-doped with arsenic (FIG. 4) having a thickness of preferably 600 nm is grown epitaxially.

Figure 5:
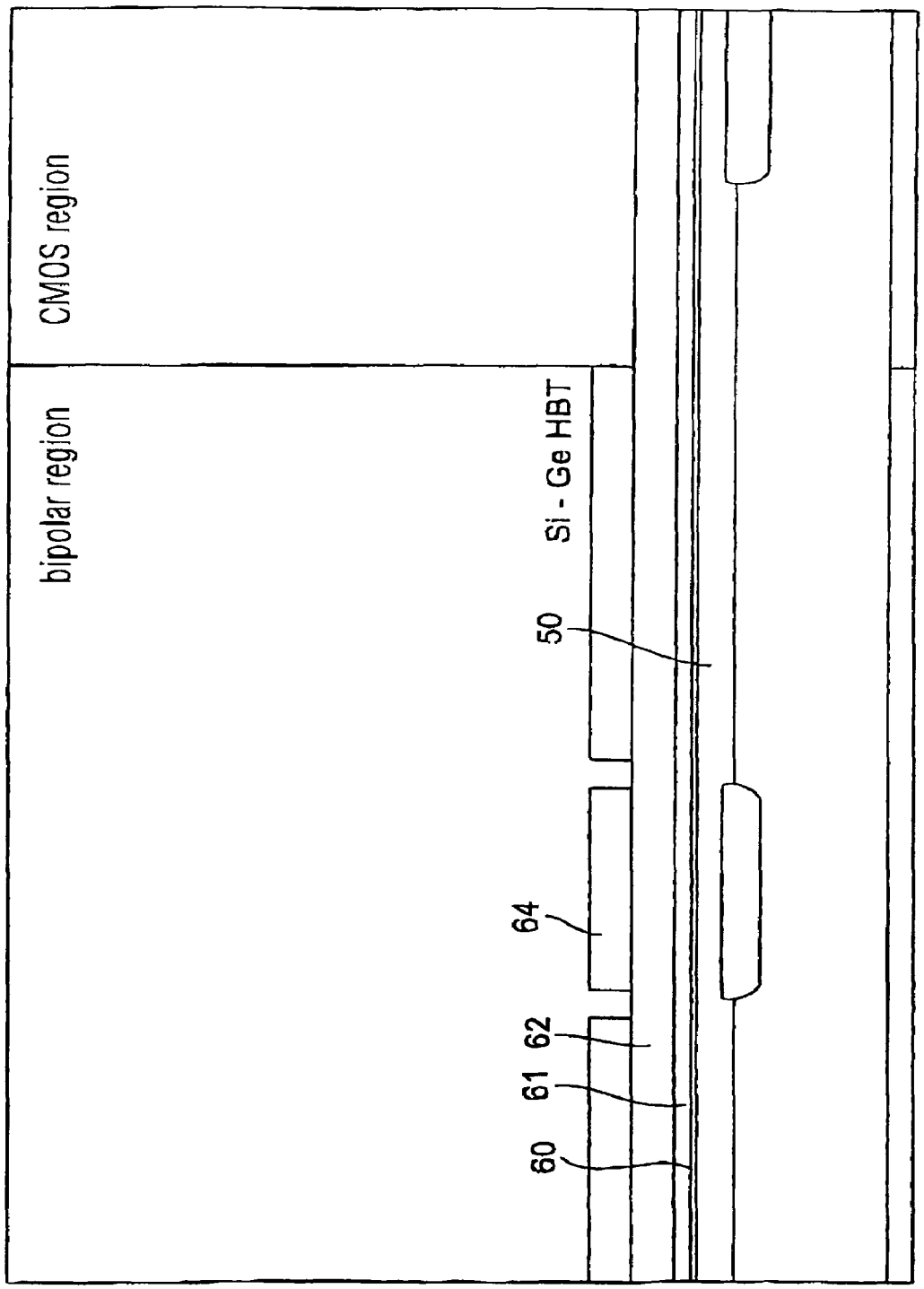
FIG. 5 shows a cross-section through an integrated circuit after a lithography step for defining trenches for the transistor region.

As is to be seen in FIG. 5, then first an oxide 60 having a thickness of preferably 5 nm is applied to the epitaxy layer 50. Then, a nitride 61 is applied, preferably with a thickness of 100 nm. Then follows an oxide layer preferably formed of BPSG and denoted with the reference number 62 in FIG. 5. Then follows a photolithography step with a mask 64 to structure the oxide layer 62 to define regions in which deep trenches are to be formed.

Figure 6:
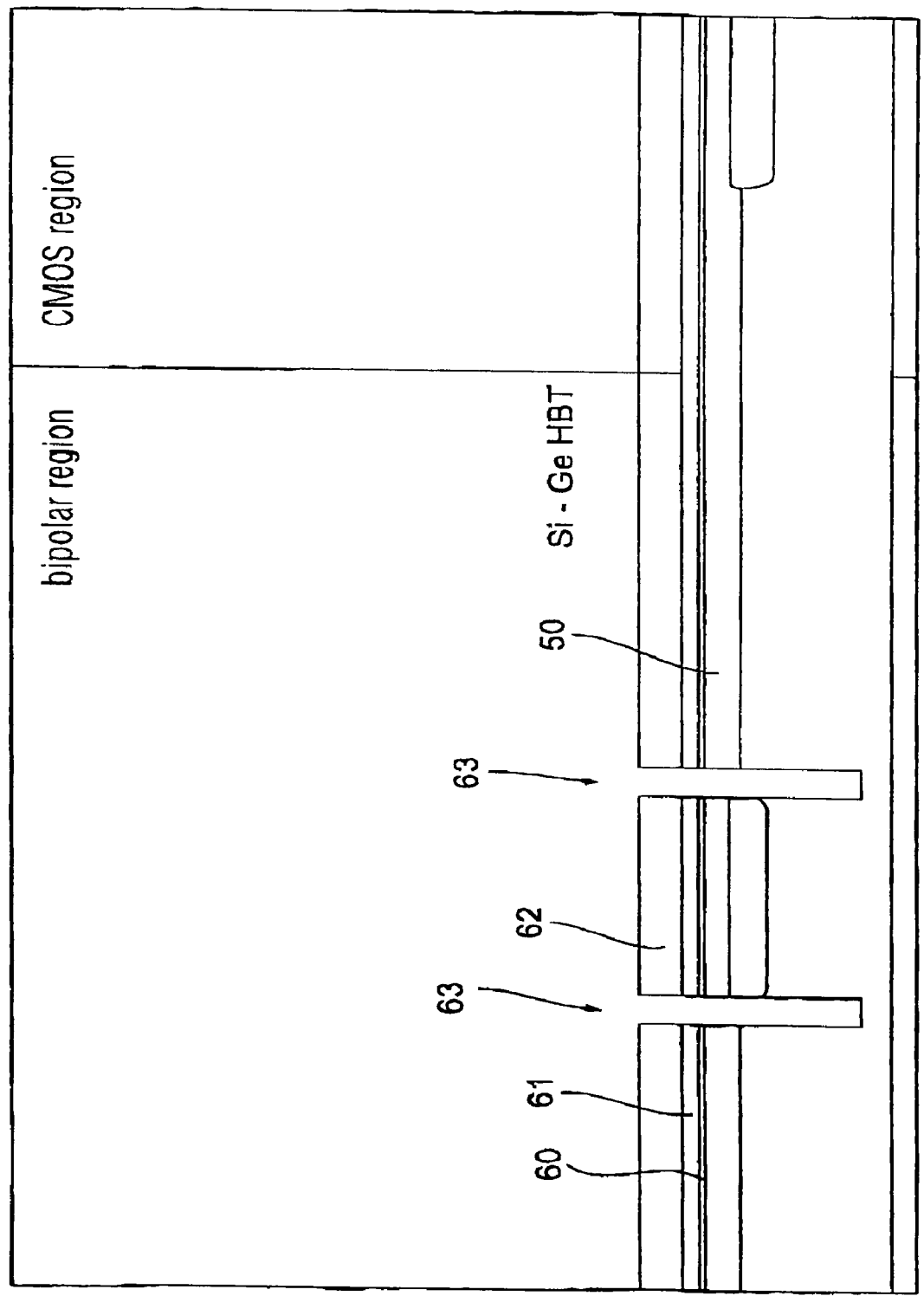
FIG. 6 shows a cross-section through an integrated circuit after etching the isolation trenches for the transistor region.

In accordance with the lithography mask 64, the BPSG oxide is then etched to generate regions for the deep trenches 63 in FIG. 6 in the oxide layer 62.

Then, the photo-resist 64 is removed and, with the BPSG oxide 62 as etching mask, an etching is performed which reaches both through the nitride layer 61 and the oxide layer 60 of FIG. 2 and through the epitaxial silicon 50 to a depth of about 6 μm into the semiconductor substrate 12 to obtain the structure shown in FIG. 6.

Figure 7:
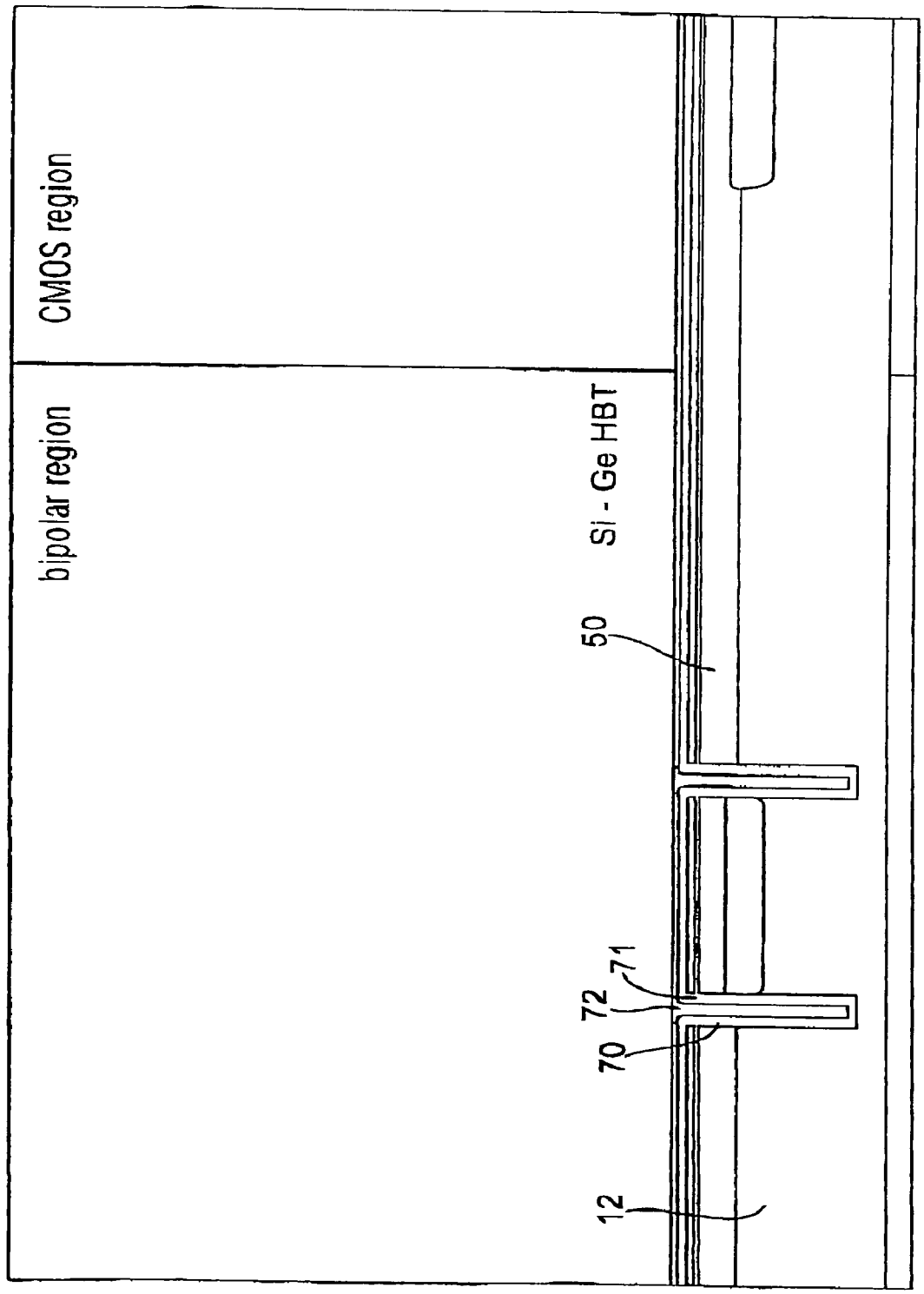
FIG. 7 shows a cross-section through an integrated circuit after filling the trenches.

Then, the BPSG mask 62 of FIG. 6 is removed, as illustrated in FIG. 7, to generate then a first oxide layer 70 with a thickness of preferably about 50 nm in the trenches by thermal oxidation, to which then a further oxide layer 71 is applied up to a thickness of about 200 nm by means of CVD. Subsequently, a polysilicon layer 72 is applied to the entire integrated circuit and particularly into the trenches, which is to obtain a thickness of about 150 nm on the surface of the integrated circuit.

Figure 8:
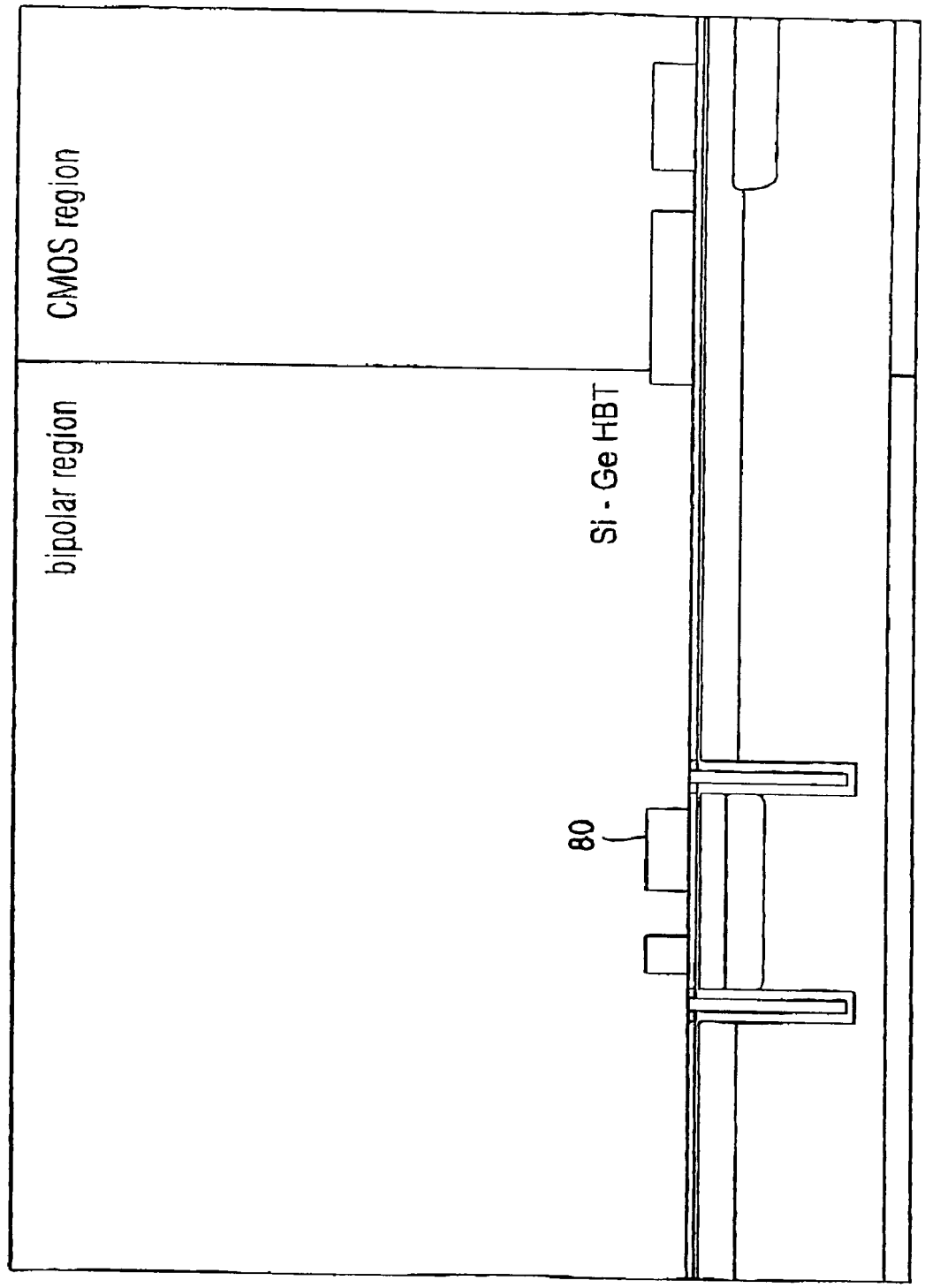
FIG. 8 shows a cross-section through an integrated circuit after a lithography step for defining the active zones in the bipolar region and in the CMOS region.

As is to be seen in FIG. 8, outside the trenches, the polysilicon 72 and the oxide layer 71 are removed down to the nitride layer below by plasma etching and/or wet etching. Then follows a lithography step to generate a photo-resist mask 80 for the definition of the shallow trench isolation.

To obtain the structure shown in FIG. 9, plasma etching of the nitride layer 61 of FIG. 6 and the oxide layer 60 below is then performed depending on the mask 80 of FIG. 8, so that only the regions shown in FIG. 9 of these layers 60 and 61 remain. The etching is a non-selective plasma etching depending on the photo-resist mask 80 of FIG. 8, as mentioned above. Then, the photo-resist is removed. Then, a thermal oxide with a thickness of 10 nm is generated in the trenches. Afterwards, a PECVD oxide with a thickness of 500 nm is applied. Finally, a chemical mechanical polishing is performed to obtain the structure of FIG. 9 concerning both the bipolar region and the CMOS region. The steps described in this section generate the known, so-called "shallow trench isolation". Of course, other isolation methods may be employed as well.

Figure 9:
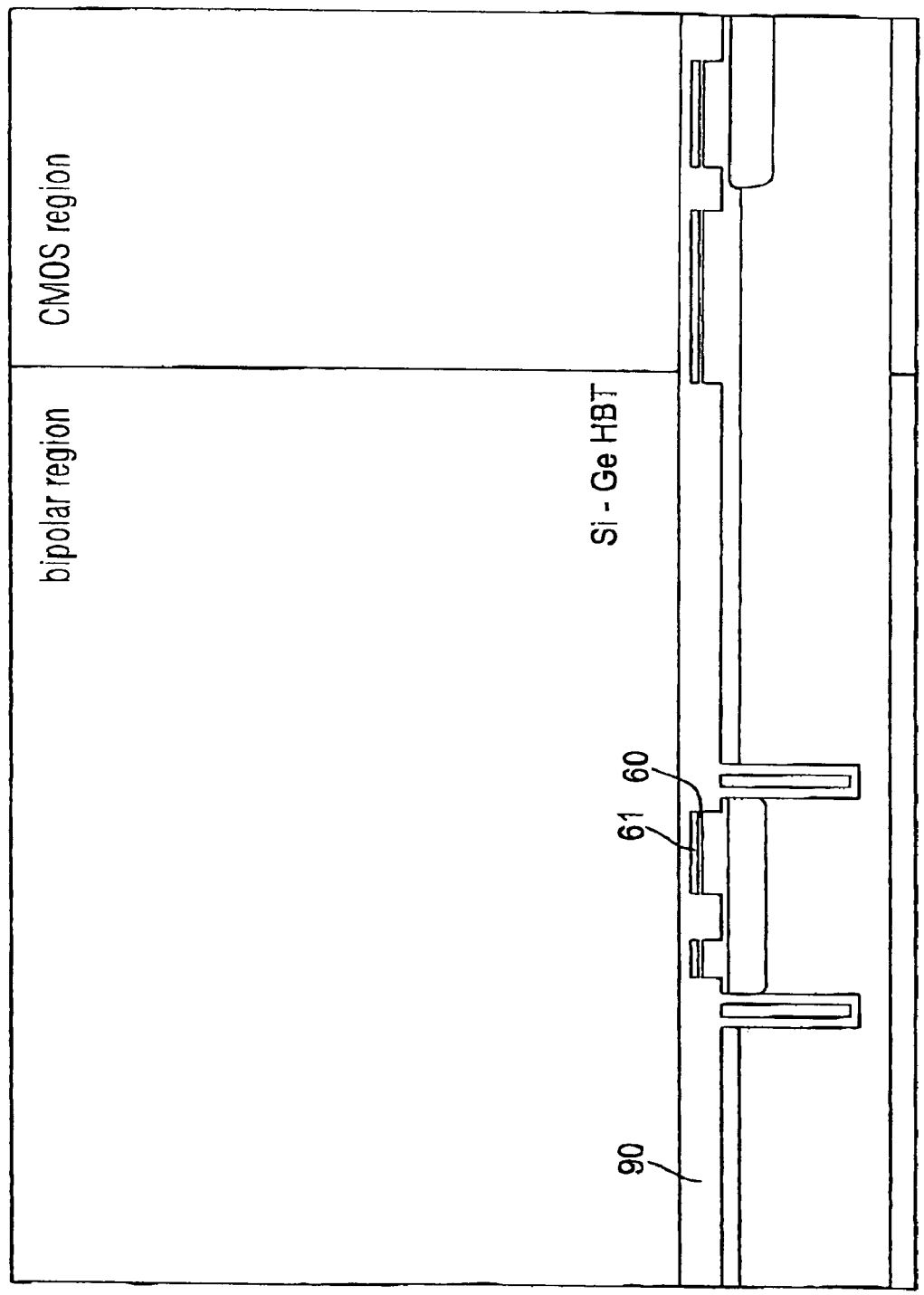
FIG. 9 shows a cross-section through an integrated circuit after chemical mechanical polishing (CMP)
Figure 10:
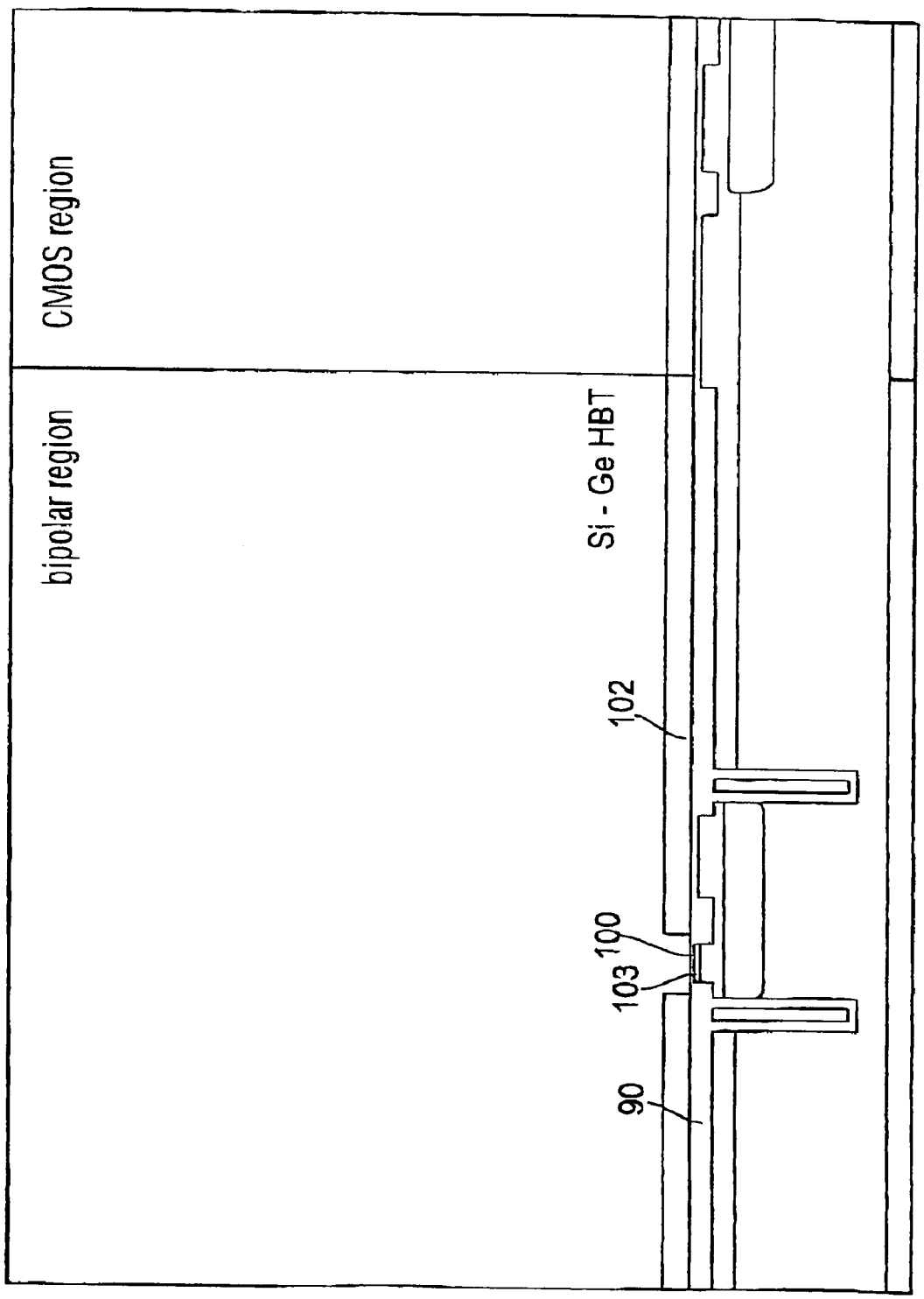
FIG. 10 shows a cross-section through an integrated circuit after a lithography step for defining the collector contact of the bipolar transistors.
Figure 11:
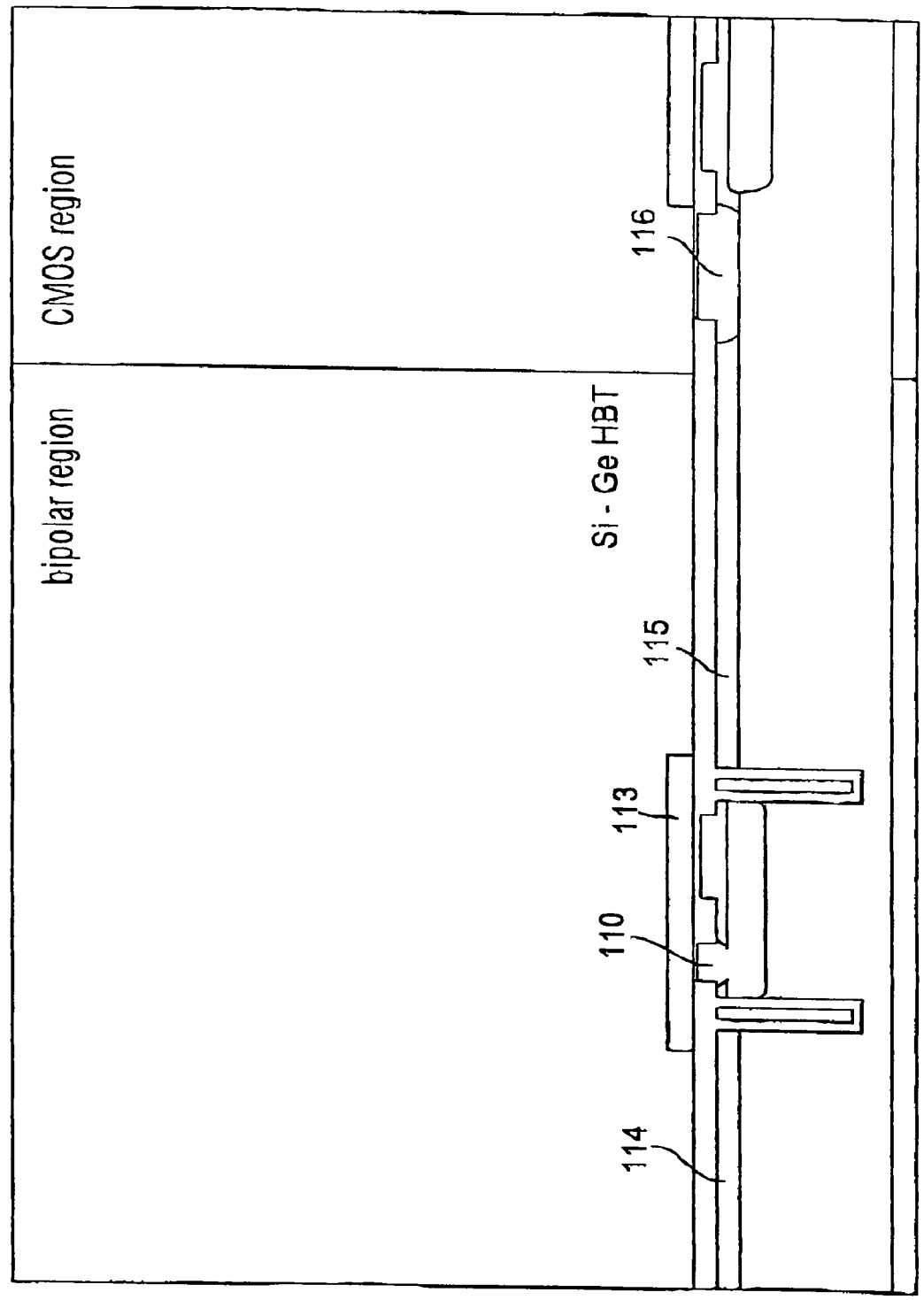
FIG. 11 shows a cross-section through an integrated circuit after a lithography step for defining p-regions as CMOS wells and as isolation regions.

Then, the oxide layer 90 of FIG. 9 is etched, as shown in FIG. 10. This etching further involves the nitride layer 61 and the oxide layer 60 below the nitride, so that only part of the oxide layer 90 remains in FIG. 10. On the exposed silicon areas, a thin oxide layer of about 7 nm is generated by means of thermal oxidation, which serves as scattering oxide for the following implantation. This layer is denoted by 100 in FIG. 10. Next, another mask 102 is generated to define regions in which then a donator, preferably phosphor, is implanted with a very high dosage of some $10^{15}$ cm$^{-2}$.

After that, the photo-resist 102 is removed, and the implantations in region 103 are outdiffused by means of a thermal treatment to create a collector terminal region 110. Then, another mask 113 is generated in a further lithography step to define the regions of the CMOS p-wells and the isolation regions. The areas of the integrated circuit not covered by photo-resist are implanted with boron in a way that the original low n-doping of the epitaxy layer in the implanted regions is completely overcompensated. This results in both isolation regions 114, 115 being generated in the bipolar region and a p-well 116 being generated in the CMOS region.

After the implantation, the photo-resist mask 113 is removed. Then, a further lithography step is performed to form a further photo-resist mask 120 covering the entire bipolar region and leaving the n-well regions in the CMOS region exposed for the implantation of phosphor.

Figure 12:
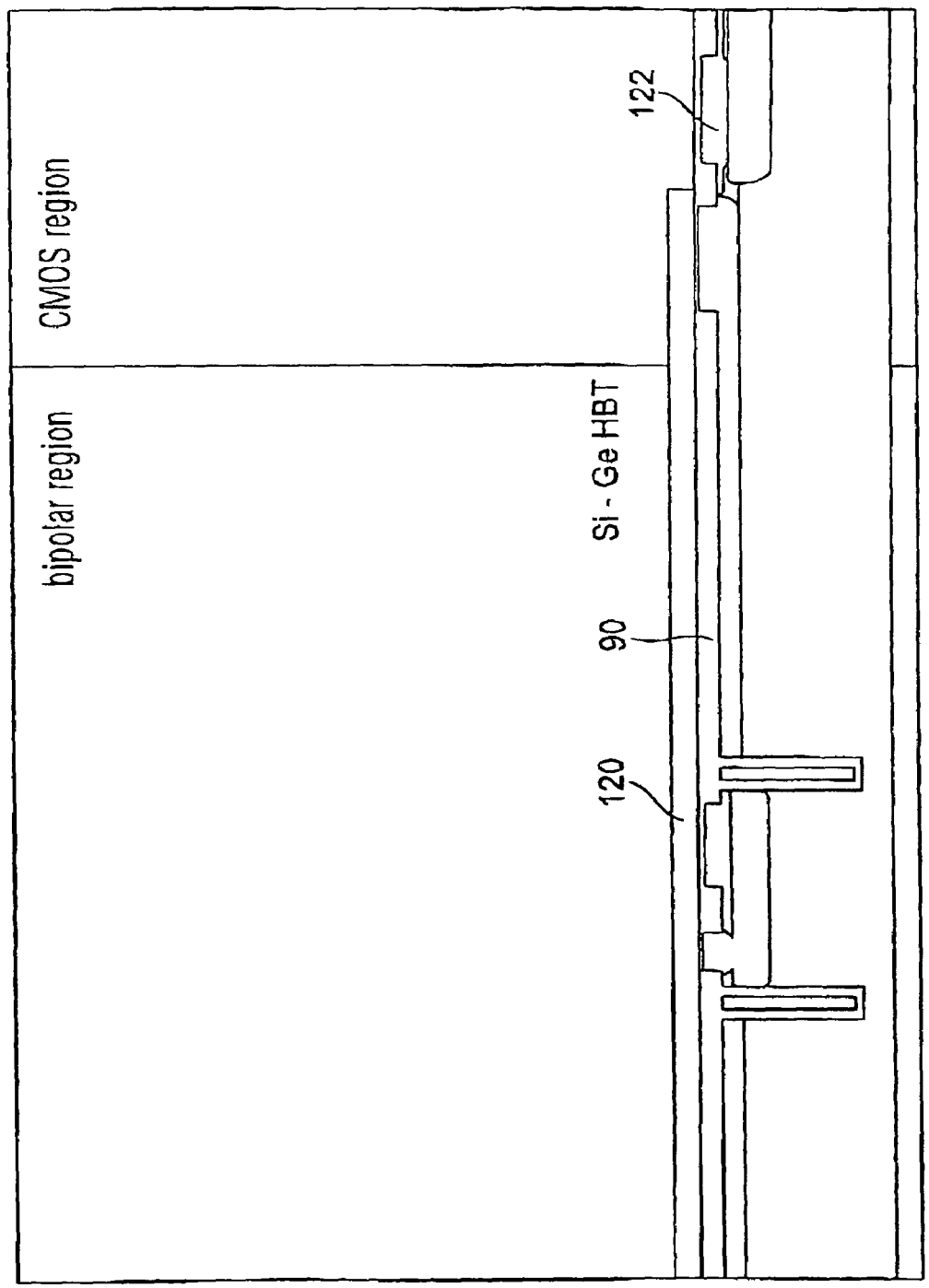
FIG. 12 shows a cross-section through an integrated circuit after a lithography step for defining the n-region in the CMOS region of the integrated circuit.

After the phosphor implantation, the photo-resist mask 120 is removed. The oxide layer 90, shown, for example, in FIG. 12, is removed by means of wet etching. The exposed silicon surface is oxidized to obtain a thin oxide layer 130 of a thickness of about 5 nm which will act as gate oxide in the CMOS region. Undoped polysilicon is applied to the whole area of the gate oxide layer up to a thickness of preferably 100 nm by means of an LP-CVD method. The polysilicon layer is denoted by 131. A CVD oxide is applied to the polysilicon layer 131 preferably up to a thickness of 30 nm. By means of a photo-resist mask 132, now the whole region of the integrated circuit is covered that does not include either a silicon-NPN bipolar transistor or a silicon-germanium HBT.

It is to be noted that, for providing a good overview, a region of the circuit in which a bipolar transistor is generated is illustrated separated from a region of the circuit in which an HBT is generated in the following figures. Now, the oxide layer 133 is removed in the transistor regions for BT and HBT by means of plasma etching.

Next, the resist mask 132 is removed. Then, plasma etching of the polysilicon layer 131 is performed. This etching is masked by the CVD oxide layer 133 and stops on the gate oxide 130.

Next, a material for the later placeholder layer is deposited in the HBT over the entire circuit, wherein this material is preferably a CVD oxide. The placeholder layer is denoted by 150 in the HBT region. Over the same, a nitride layer 151 is applied, which is covered by a lithography mask 152. It is to be seen from FIG. 15 that the mask 152 only covers HBT regions, but no BT regions. After that, plasma etching of the nitride layer 151 is performed so that the nitride layer is removed in all places where there is no mask 152.

Figure 16:
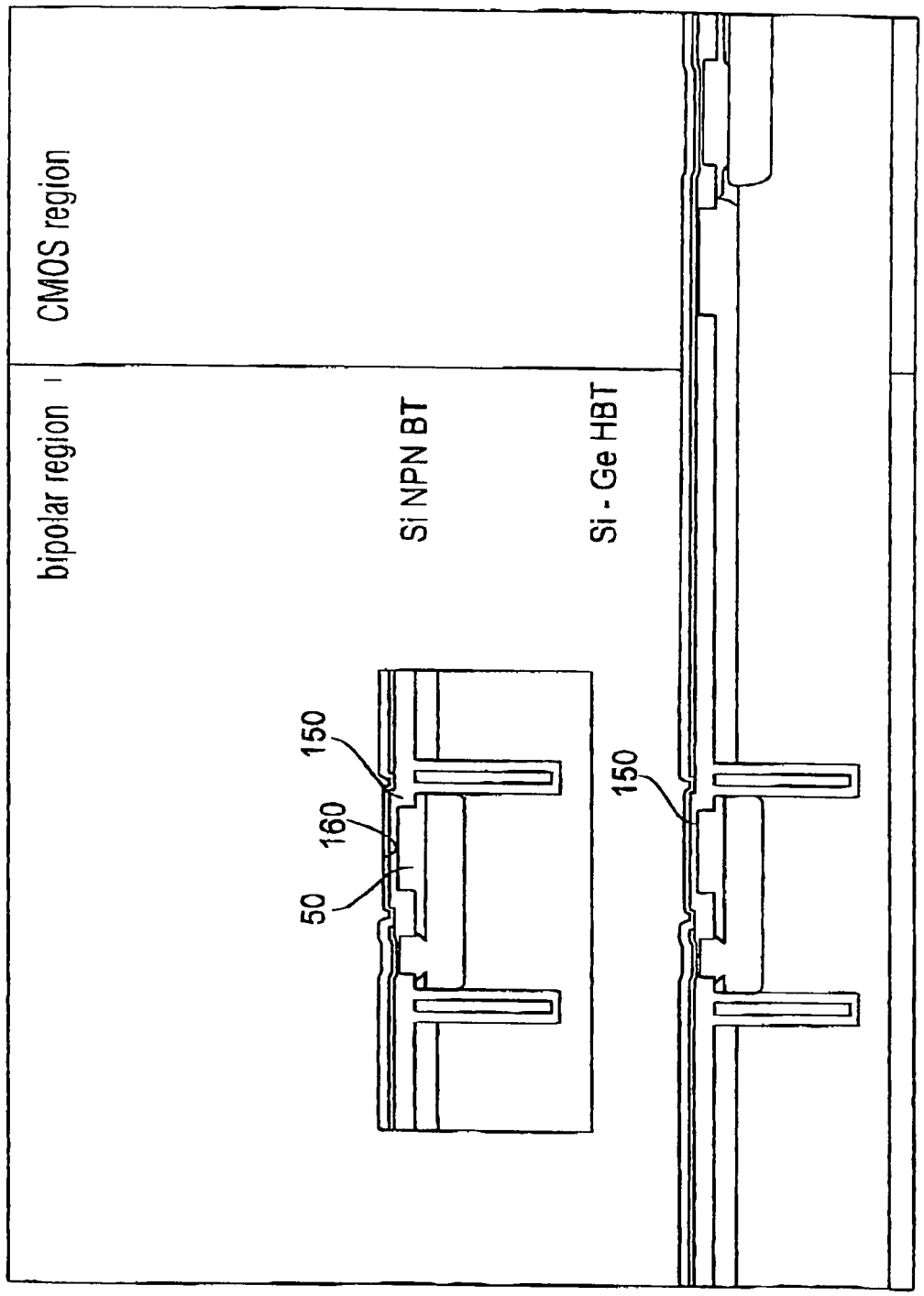
FIG. 16 shows a cross-section through an integrated circuit after growing the upper polysilicon layer.
Figure 17:
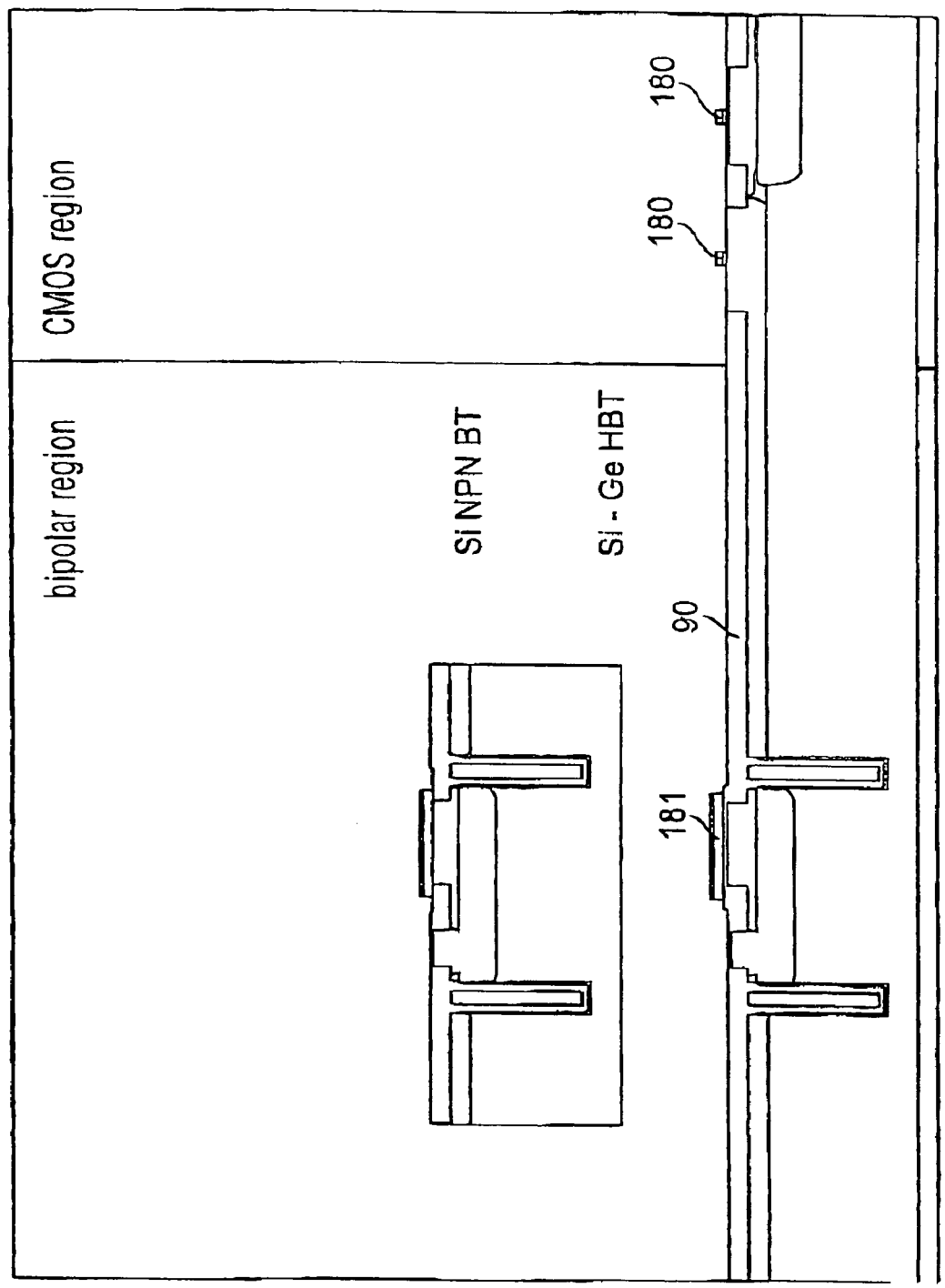
FIG. 17 shows a cross-section through an integrated circuit after etching the gate contacts in the CMOS region and the base terminals in the bipolar region.

As is apparent from FIG. 16, the mask 152 is removed. After that, oxide etching is performed, wherein, however, the nitride layer 151 acts as mask for the oxide etching. This results in the oxide layer 105 being removed in the bipolar region, while it is protected by the nitride layer 151 in the HBT region and therefore is not removed, but remains as placeholder layer. Then, after the oxide etching, the nitride 151 is removed by means of wet etching, wherein phosphoric acid is preferably used as etchant. This results in the placeholder layer 150 now being present in the HBT region, while it is no longer present in the BT region. Finally, as is to be seen in FIG. 16, undoped polysilicon is applied over the entire circuit by means of an LPCVD process. The thickness of the polysilicon layer 160 is preferably 150 nm. Later on, this polysilicon layer will act as base contact structure both for the BT and for the HBT.

Now an oxide layer is applied over the entire circuit up to a thickness of preferably 55 nm by means of an LPCVD process. After that, a lithography step is performed by which a mask is generated which defines the gate contacts in the CMOS region and which covers the active transistor regions of BT and HBT in the bipolar region.

With the resist mask, the oxide layer is structured which then, after removing the resist mask, serves in turn as mask for etching the polysilicon. Thus, gate contacts 180 and the base contact structure 181 of FIG. 18 result.

In the following, typical process steps for the production of CMOS transistors are performed: LDD implantations, generation of the spacer and an n+ implantation for source, drain and gate of the n-channel transistor.

After that, a mask 230 is applied to define implantation regions for the implantation of the base contact structure 181 of both the BT and the HBT. The undoped polysilicon of the base contact structure 181 is then implanted with boron. The mask 230 is then removed, followed by cleaning. Then, a multi-layer structure is grown. First, an LPCVD nitride layer with a thickness of preferably 25 nm is generated, which is denoted by 240 in FIG. 19. Then, an LPCVD-TEOS layer 241 is applied preferably up to a thickness of 100 nm. Then follows another, but now thicker LPCVD nitride layer 242, which has a thickness of preferably 100 nm. After that, another mask 243 is applied to define emitter windows both for the BT and for the HBT. The emitter windows 244 are then opened as far as the base contact structure 181 by means of plasma etching, as shown in FIG. 19. After that, the mask 243 is removed. Now, the base contact structure 181 of FIG. 19 is plasma etched so that it is no longer present in the region of the emitter windows 244. In the case of the HBT, the plasma etching of the base contact layer 181 stops on the placeholder layer 150. In the case of the bipolar transistor, the silicon epitaxy layer 50 is slightly etched. After that, a scattering oxide for the base implantation is grown on the monocrystalline semiconductor layer 50 of the bipolar transistor. Subsequently, an implantation of the base of the silicon bipolar transistor is: performed, wherein the base of the bipolar transistor is to be provided with a p-doping. The implantation energy is so low that the placeholder layer 150 in the HBT is not penetrated. Thus, no p-doping of the HBT occurs, but what does occur is a p-doping of the base of the bipolar transistor, wherein the base of the bipolar transistor is to become as thin as possible to obtain a fast bipolar transistor.

After that, a selective collector implantation is performed, also through the emitter window 244, to generate a more highly n-doped region 251 both in the BT region and in the HBT region. For this, a two-stage implantation method is used, in which phosphor is employed in both stages. It is to be noted that the region 251 from the collector structure, which is more highly doped, is shorter in the direction perpendicular to the surface for the bipolar transistor than for the hetero bipolar transistor, as the base of the bipolar transistor is formed in this region, so to speak, while the base of the hetero bipolar transistor is formed on this region 50, as will be discussed in the following. In addition, it is important that the region 251 is doped so that the collector bulk resistance does not become too large due to the monocrystalline silicon region 50, which is not so highly doped.

An advantage of the inventive process technology is that the selective collector implantation may be performed with high energy, because implantation atoms with high energy simply land in the buried layer 32 and are of no importance there. Thus, the different length of the region 251 for BT and HBT may be readily "compensated".

After the implantation of the base of the bipolar transistor and the collector regions of the bipolar transistor and the hetero bipolar transistor, the doping profile of the base 252 is adjusted by means of a diffusion step, preferably with an RTP process.

After annealing, an LPCVD nitride layer with a thickness of preferably 50 nm is applied, which is denoted by 260. Further, an LPCVD-TEOS layer 262 is applied to the LPCVD nitride layer 260. By means of a photolithography step, a resist mask 264 is generated which covers the bipolar transistor, while the HBT is not covered. Then, the TEOS layer 262 is etched out of the HPT region depending on the mask, so that only the nitride layer 260 remains in the emitter window of the HBT, from which, finally, nitride spacers will be formed.

Figure 22:
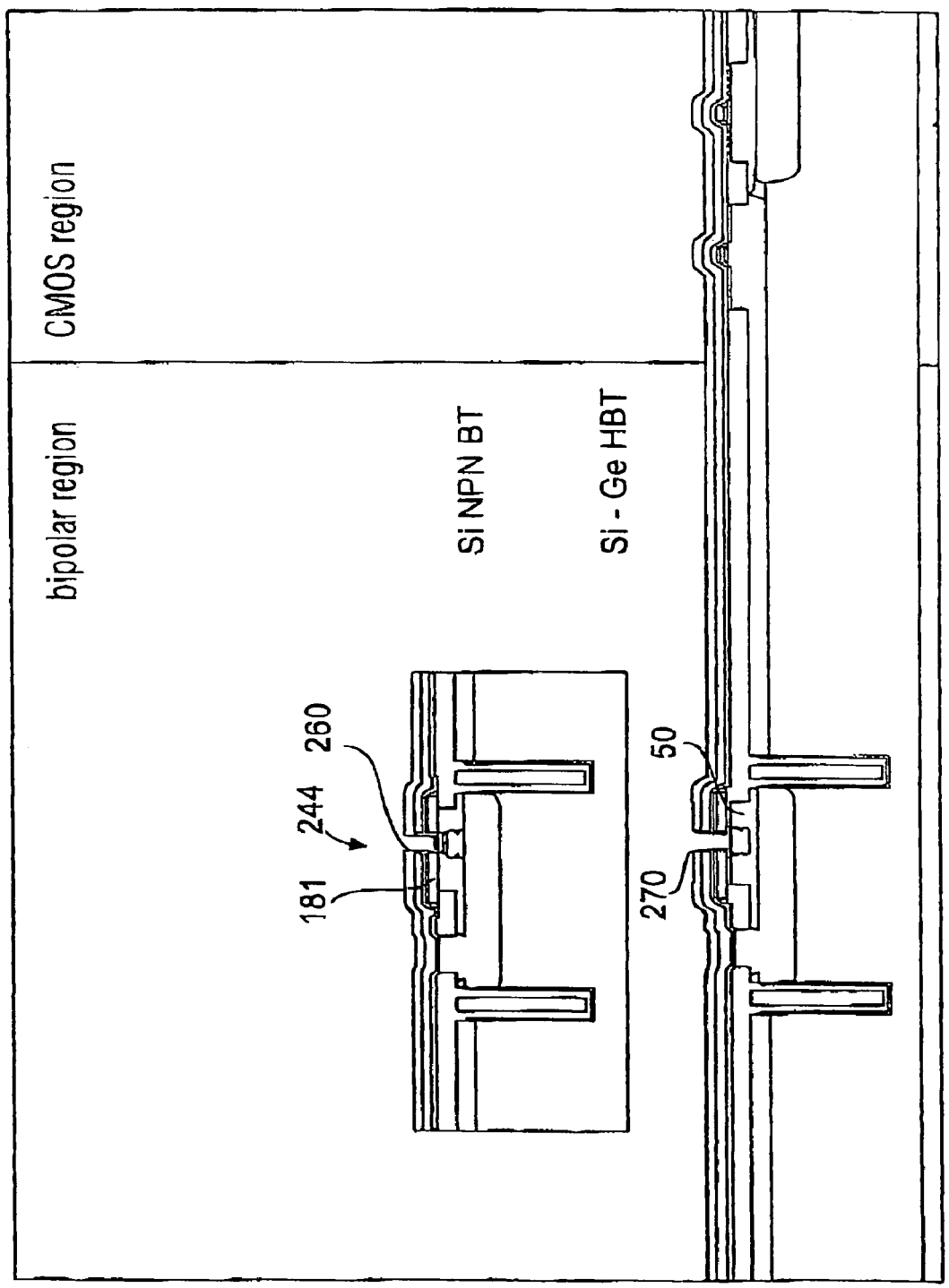
FIG. 22 shows a cross-section through an integrated circuit after the spacer etching and removing the placeholder layer.

After that, the mask 264 is removed, and plasma etching of the nitride 260 follows in the regions where it is no longer covered by the oxide layer 262, to give the nitride the form shown in FIG. 22. Next, wet etching with hydrofluoric acid is performed to etch the placeholder layer 150 out of the HBT. At the same time, the oxide layer 262 is removed from all places where it had still been present. This wet etching has no effect on the emitter window 244 of the bipolar transistor, because there is a nitride layer on the bottom of the emitter window of the bipolar transistor which is not attacked by the wet etching for removing the placeholder layer.

In the process state shown in FIG. 22, a selective epitaxial deposition of silicon germanium is performed. In this process step, material is only added to exposed monocrystalline or polycrystalline silicon surfaces. Therefore, the layer deposition only occurs in the region freed from the placeholder layer 150. Here, the silicon-germanium base 280 of the HBT is formed. The SiGe-Epi also grows on the exposed bottom of the base terminal poly and, thus, establishes the base contact.

Figure 18:
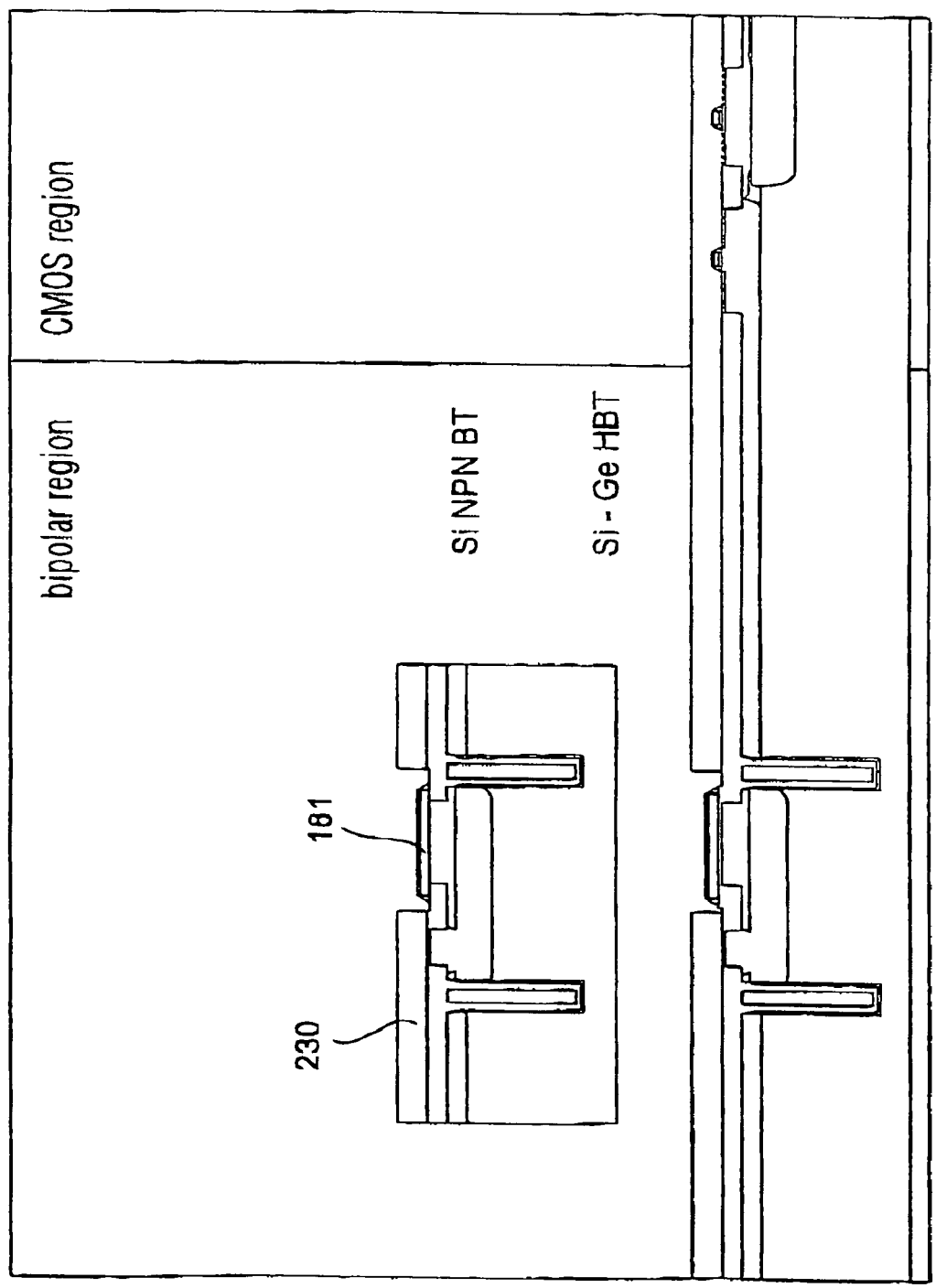
FIG. 18 shows a cross-section through an integrated circuit after a lithography step for implanting the polysilicon base terminal region in the bipolar region.

After the silicon germanium epitaxy of FIG. 18, nitride etching is performed to remove the nitride layers 260 in the bipolar region and in the HBT region. Subsequently, an HF dip of the integrated circuit structure takes place to remove also the scattering oxide below the nitride layer 260 of FIG. 21, which is denoted by 250 in FIG. 20.

Figure 23:
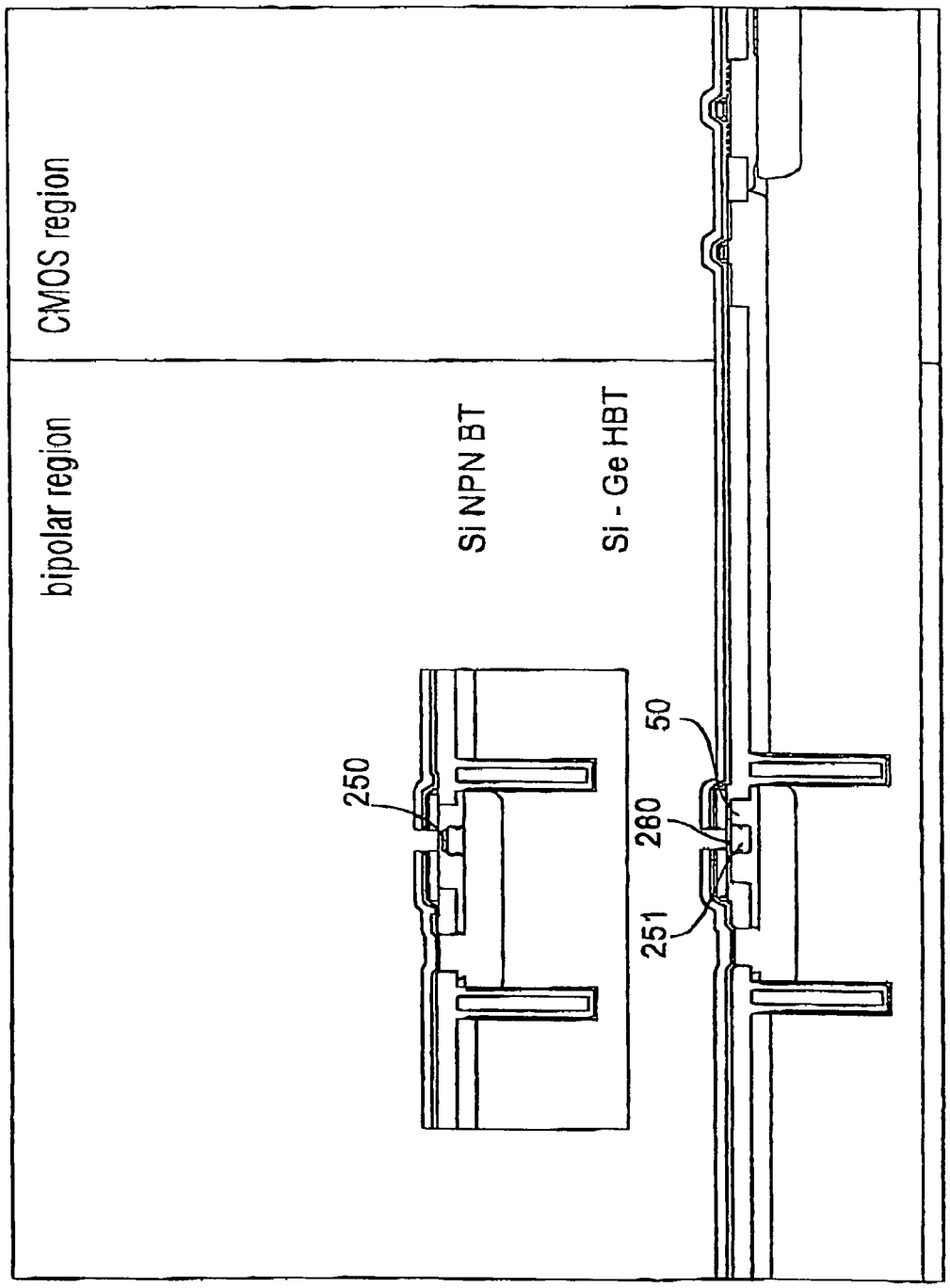
FIG. 23 shows a cross-section through an integrated circuit after the selective epitaxy of silicon germanium in the region of the hetero bipolar transistor from which the placeholder layer has been removed.

FIG. 23 thus shows the integrated circuit in a state in which both the p-base 250 and the silicon-germanium base 280 are exposed. The structure in FIG. 23 is thus in the same initial state both for the bipolar transistor and for the hetero bipolar transistor, so that now identical processing steps may be performed for both types of transistors to finish the transistors by production of the emitter structure.

Figure 25:
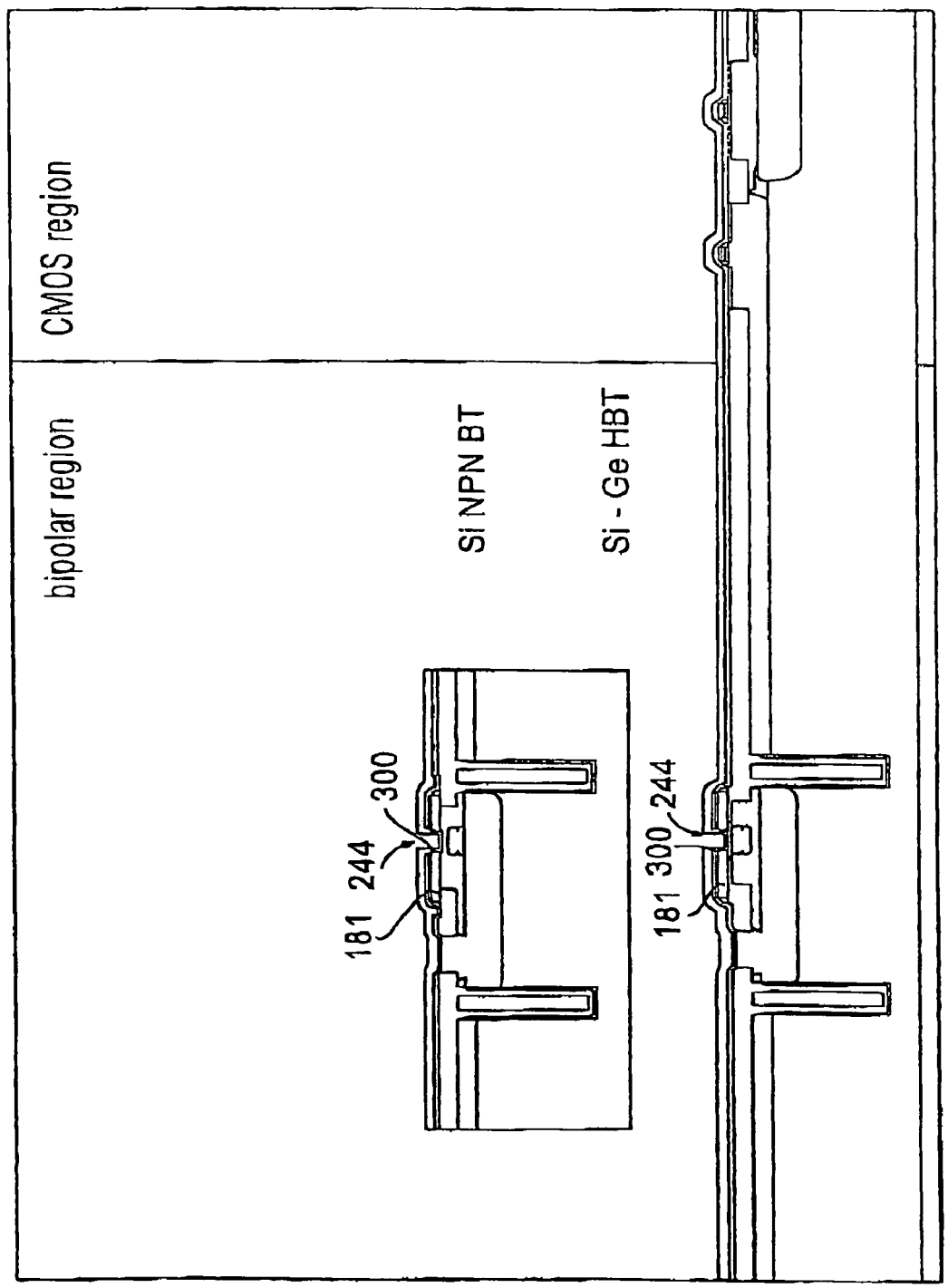
FIG. 25 shows a cross-section through an integrated circuit after producing the spacers in the respective emitter windows of the bipolar region.

For this, first an LPCVD-TEOS with a thickness of 55 nm is applied to the circuit, which results in a layer 290. Then an LPCVD nitride with a thickness of 100 nm is applied, which results in the entire circuit being covered with nitride. Subsequent plasma etching removes the nitride layer completely, except for remaining sidewall spacers 292 at steep steps, particularly on the walls of the emitter windows both in the bipolar transistor and in the HBT. With hydrofluoric acid etching, the oxide layer 290 is removed from all places where it is no longer covered by nitride. Thereby, L-shaped (viewed in cross-section) oxide spacers 300 remain in the emitter windows. This spacer serves for the isolation of the base contact structure 181 from the emitter structure to be generated, explained with respect to FIG. 26. The nitride spacers have fulfilled their purpose and are removed by means of phosphor acid etching. The resulting structure is illustrated in FIG. 25.

After that, an LPCVD polysilicon 312 doped with arsenic is applied as emitter contact and emitter dopant source and is structured with a lithography step with mask 314 by means of plasma etching. The two transistors are now finished, except for the wiring and direct contacting of the emitter, the base and the collector of the transistor now to be performed.

In the following, both the bipolar transistor 316 and the hetero bipolar transistor 317 in the bipolar region and the first field-effect transistor 318, which is a p-channel field-effect transistor, and the second field-effect transistor 319, which is an n-channel transistor, are described in summary with respect to FIG. 26.

The collector structure both of the silicon npn bipolar transistor and the silicon-germanium hetero bipolar transistor consists of the buried layer 32, which is more highly n-doped. Therefore, it is to be seen from FIG. 26 that the collector regions both of the bipolar transistor and of the HBT are formed of the same production layers.

The hetero bipolar transistor includes a silicon-germanium base 280, while the bipolar transistor comprises a p-doped silicon base 250.

The emitter structures for both transistors are again formed of identical production layers. They first include the L-spacer 300 in the emitter window. The actual emitter is given by the interface of the layer 310 and the base 250 and/or 300 below.

In the CMOS region, two types of transistors are found, as is typical: the first transistor 318 lies in a p-well 116, is an n-channel transistor and includes source/drain zones 221, a gate oxide 130, and the gate electrode of polysilicon with a highly n-doped upper layer for contacting.

The second field-effect transistor 319, however, is a p-channel field-effect transistor with an n-well 122, p-doped source/drain zones 202, a gate oxide 130, and a gate contact 190.

Figure 13:
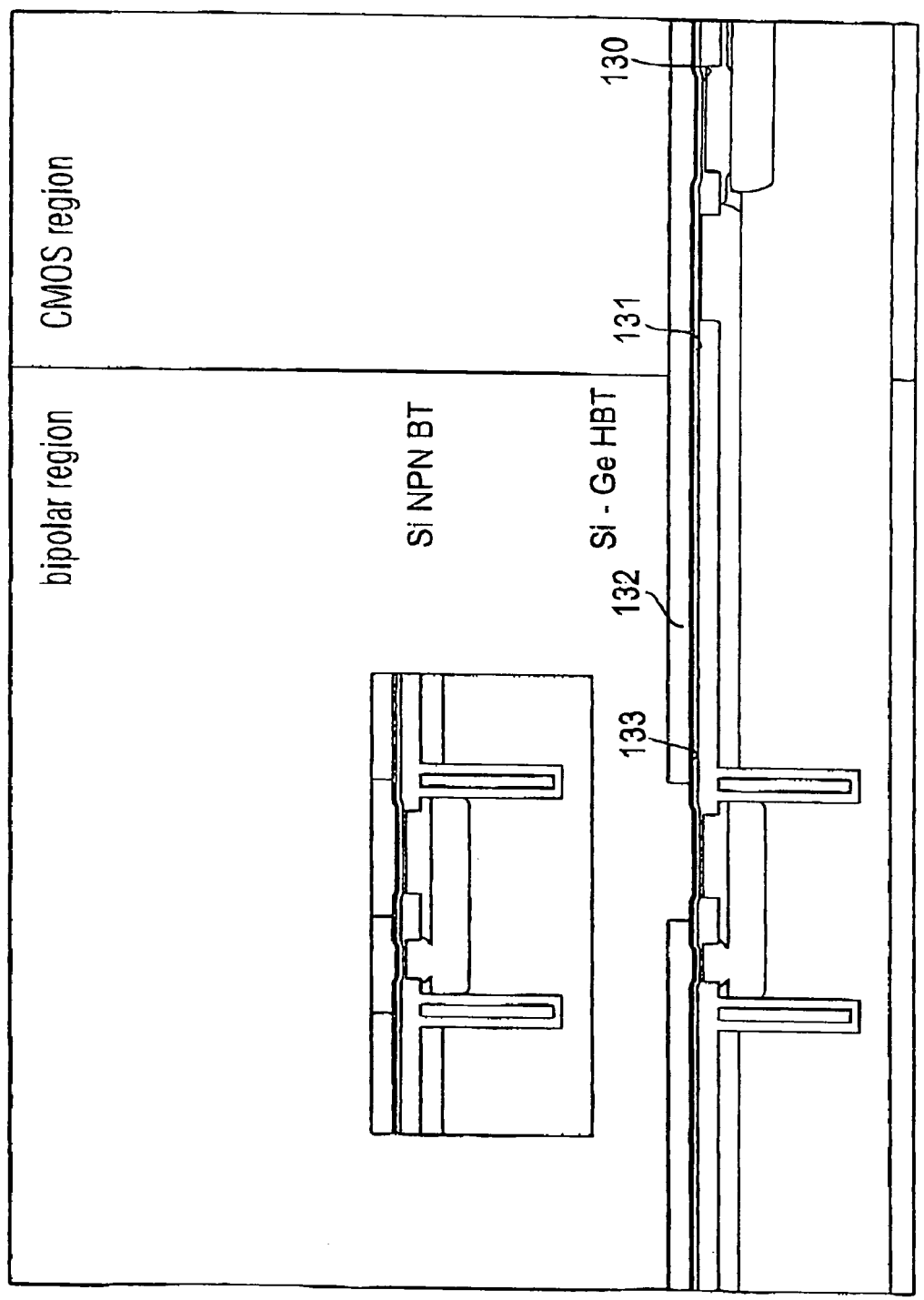
FIG. 13 shows a cross-section through an integrated circuit after a lithography step for processing the base regions of both the npn bipolar transistor (BT) and the hetero bipolar transistor (HBT)

In the following, the important steps are once more summarized, structured in groups. FIGS. 1 to 13 show a BiCMOS process which does not yet distinguish between bipolar transistor and hetero bipolar transistor. In FIG. 13, the first layer of the so-called split polysilicon, i.e. the double polysilicon, is then applied for the CMOS gate. In FIGS. 13 and 14, a lithography step is further illustrated to remove the first layer of the split polysilicon layer on the active regions (emitter base) of the bipolar transistor and the HBT. In FIG. 15, applying a TEOS layer with a thickness of about 120 nm is shown, wherein this layer 150 will act as placeholder layer when, after removal of this layer in a later step, the selective silicon germanium epitaxy is performed in the HBT base regions.

In FIG. 15, a lithography step for structuring the TEOS placeholder layer is shown to remove it in the active regions of the bipolar transistors.

In FIG. 16, the upper layer of the split polysilicon structure is applied. With respect to FIG. 17, the lithography for the CMOS gates and the CMOS process block for the production of the first and second field-effect transistors are shown.

In FIG. 18, the strong boron implantation of the base contact polysilicon layer 121 for both types of transistors is shown.

In FIG. 19, the emitter window is opened for both types of transistors, with the same lithography step and with the same etching.

In FIG. 20, the scattering oxide for the bipolar transistor base implantation is applied. Further, the implantation of the collector structure is shown in FIG. 20, wherein masking for high voltage transistors may optionally be performed.

Further, in FIG. 20, the base implantation for the bipolar transistor is shown, wherein a TEOS layer is present as mask for the silicon-germanium hetero bipolar transistor.

FIG. 20 further relates to the annealing of the base of the silicon bipolar transistor and the collector regions of both types of transistors.

Figure 21:
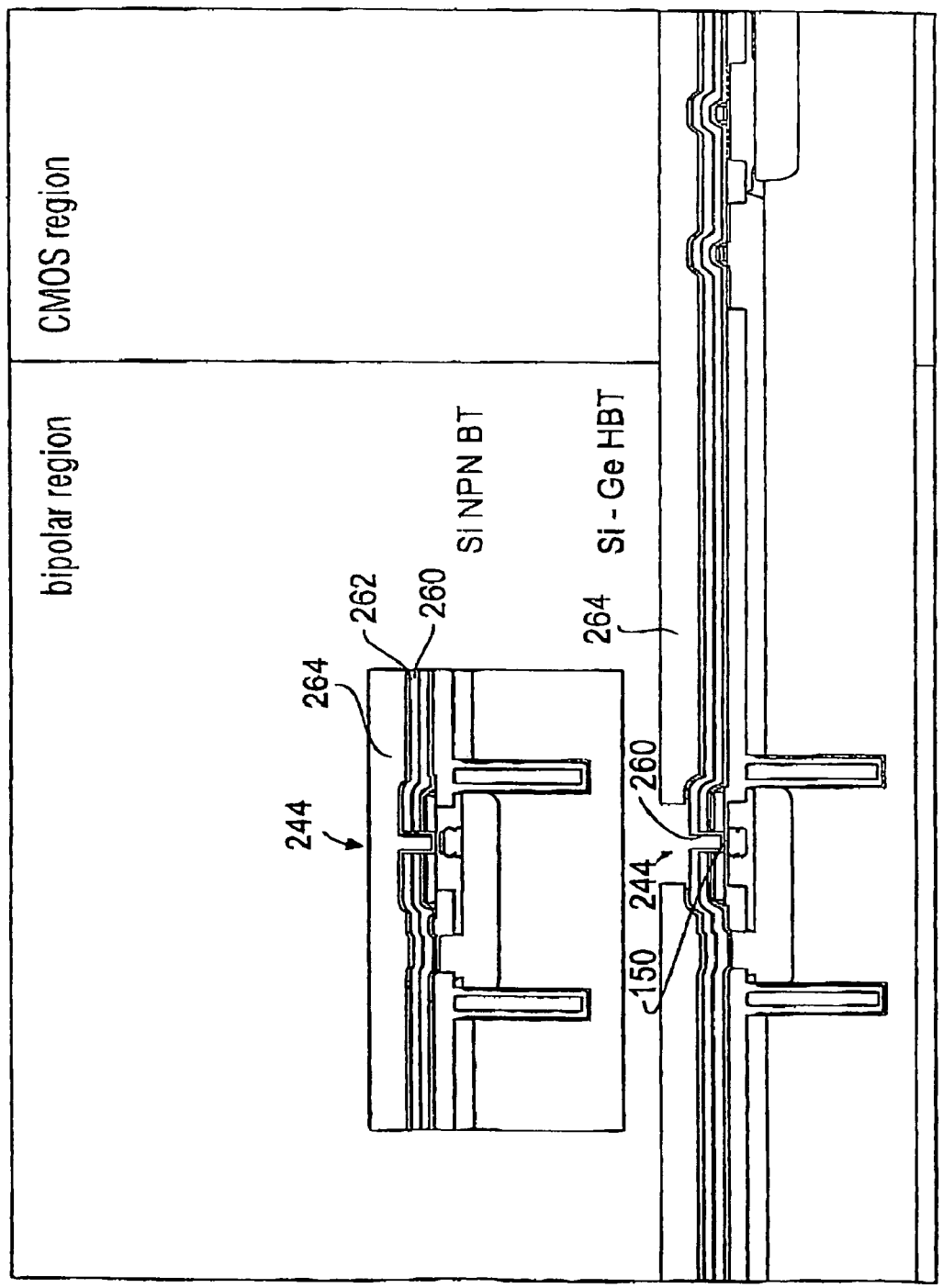
FIG. 21 shows a cross-section through an integrated circuit after a lithography step which allows etching a layer deposited in the emitter window of the hetero bipolar transistor for forming a side spacer only there and protects this layer from etching in all other regions.

In FIG. 21, a nitride cover layer is shown prior to the selective epitaxy.

What is further shown in FIG. 21 is the structuring of an oxide hard mask, which serves to prevent the nitride etching in the emitter window of the silicon bipolar transistors during the anisotropic nitride etching for the generation of nitride spacers in the emitter window of the silicon-germanium hetero bipolar transistors illustrated in FIG. 22.

FIG. 22 further relates to a wet etching of the TEOS layer, wherein the hard mask is removed, and wherein further the placeholder layer is removed to finally achieve a silicon germanium epitaxy in the emitter window and in a small region below the base contact polysilicon 181.

The selective silicon germanium epitaxy then occurs in FIG. 23. In FIG. 23, also wet etching of the nitride layer occurs which served for covering all zones on which the deposition of the epitaxial layer was to be prevented.

Figure 24:
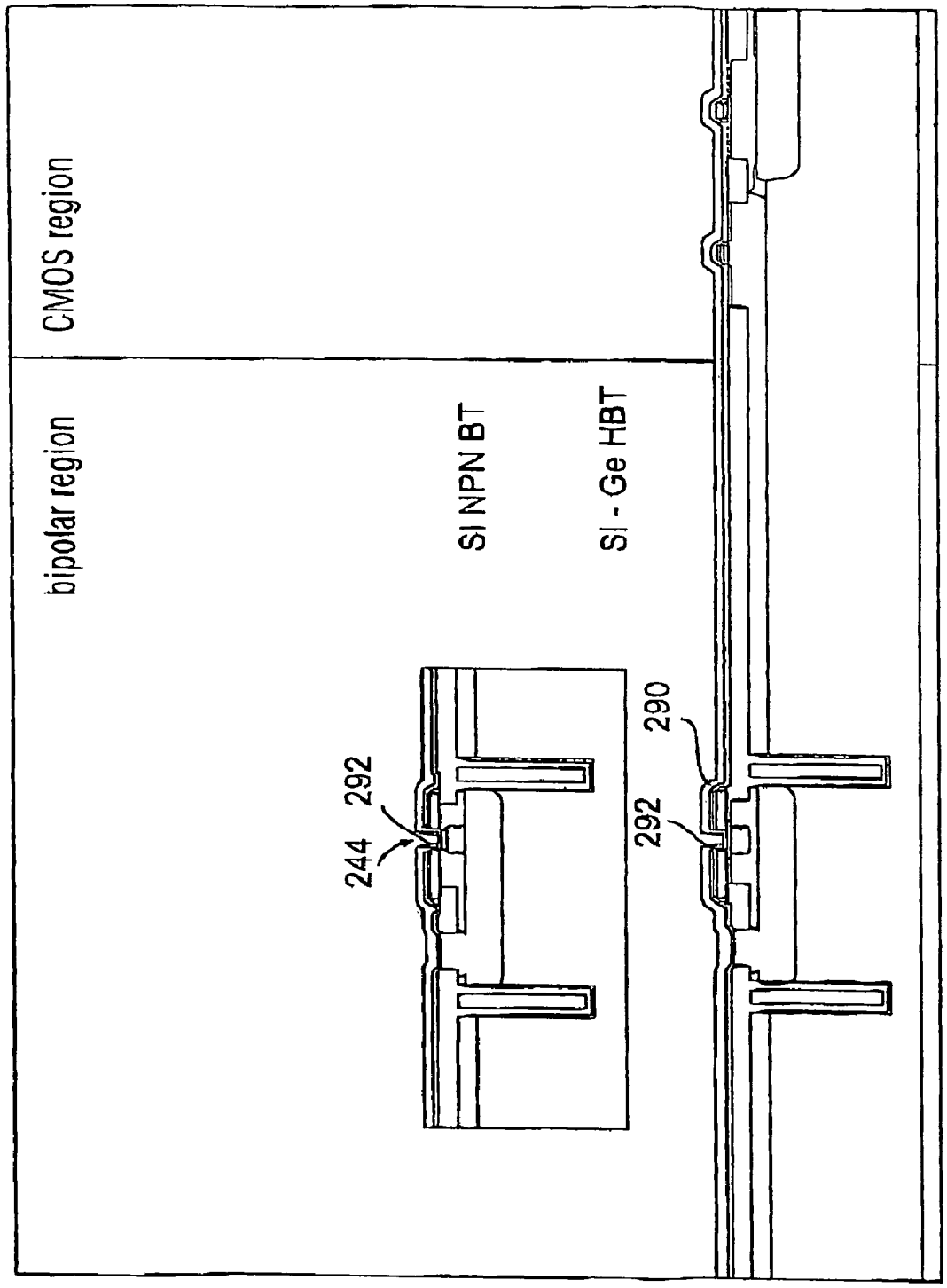
FIG. 24 shows a cross-section through an integrated circuit after an intermediate step for producing spacers in the respective emitter windows in the bipolar region of the integrated circuit.

In FIGS. 24 and 25, the process steps are illustrated which generate an L-spacer for both types of transistors at the same time. The emitter polysilicon deposition and structuring explained with respect to FIG. 26 again takes place for both transistors at the same time.

An advantage of the present invention is that it provides a reduced process complexity for the simultaneous integration of classic bipolar transistors and hetero bipolar transistors, wherein this concept, as it was implemented, is further compatible for a BiCMOS process.

It is particularly advantageous that the same base contact layer 181 may be employed for both types of transistors. After the first layer of the split polysilicon process applied to the gate oxide has been opened in the active regions of the bipolar transistors (FIG. 14), the TEOS placeholder layer 150 is applied, which serves to separate the base contact polysilicon from the monocrystalline silicon substrate in the silicon-germanium HBT. For structuring this placeholder layer, a lithography step is required, as discussed with respect to FIG. 15.

A further advantage of the present invention is that the same collector implantation may be performed for both types of transistors (FIG. 20). This is advantageously achieved by adjusting two or three implantations in a way that a homogeneous depth distribution of the dopants results. The more energetic part is adjusted for the silicon-germanium transistor and results in doping atoms being accommodated in the buried layer of the silicon bipolar transistor, which is uncritical. The implantation with low energy is adjusted with respect to the depth of the base collector transition of the silicon npn bipolar transistor and is partially absorbed in the TEOS placeholder layer of the HBT. In both cases, there are no damaging effects on the electric properties of the transistors.

A further advantage of the present invention is that the same nitride layer which has been used to generate the sidewall spacers on the base structure 181 of the HBT is also used for the emitter region of the classic bipolar transistor to be covered during the selective SiGe epitaxy. To protect this nitride layer in the emitter region of the bipolar transistor while the emitter window of the HBT is etched, the lithography step of FIG. 21 and an oxide hard mask are employed.

Finally, the present invention is advantageous in that the same spacers (FIGS. 24, 25) and the same emitter polysilicon layer (FIG. 26) may be used for both types of transistors.

An advantage of the present invention is that the production costs for a process flow are minimized with both HBT and BT. The advantages of the inventive technology are that the use of the yield-critical silicon-germanium HBTs may be limited to cases where the speed of the hetero bipolar transistor technology is actually required.

By employing as many classic bipolar transistors as possible, the superior matching properties of these transistors may be utilized to save chip area and improve the yield.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. An integrated circuit, comprising:
   a semiconductor substrate with layers;
   a bipolar transistor in the semiconductor substrate; and
   a hetero bipolar transistor in the semiconductor substrate,
   wherein collector structures of the bipolar transistor and the hetero bipolar transistor are formed in different regions of the integrated circuit, and
   wherein the collector structures of the bipolar transistor and the hetero bipolar transistor comprise
   a buried layer;
   a collector terminal region; and
   an upper layer which is lower doped than the buried layer, and
   wherein the upper layer comprises a region, which is higher doped than a portion of the upper layer not comprising the region, the region being disposed below a base of the bipolar transistor, and below a base of the hetero bipolar transistor,
   wherein the base of the hetero bipolar transistor is disposed on top of the region, the base of the hetero bipolar transistor of a material different from the material from which the upper layer is made, and
   wherein the base layer of the bipolar transistor is implemented by a doped region in the upper layer of the collector structure, and
   wherein a distance between the base of the hetero bipolar transistor and the buried layer measured perpendicular to the semiconductor substrate is greater than a distance between the base of the bipolar transistor and the buried layer measured perpendicular to the semiconductor substrate.

2. The integrated circuit of claim 1,
   wherein a base contacting layer is formed by a polycrystalline semiconductor material for the bipolar transistor and the hetero bipolar transistor, wherein the base contacting layer is formed of an identical layer of the semiconductor substrate in different regions of the semiconductor substrate.

3. The integrated circuit of claim 1, wherein the emitter structures for the bipolar transistor and the hetero bipolar transistor comprise:
   a side cover for an emitter window;
   a polycrystalline semiconductor material in the emitter window; and
   a contact region in which the polycrystalline semiconductor material is in contact with the base of the bipolar transistor or the base of the hetero bipolar transistor.

4. The integrated circuit of claim 1,
   wherein a base of the hetero bipolar transistor includes epitaxially grown semiconductor material that differs from the semiconductor material of which a base of the bipolar transistor is formed.

5. The integrated circuit of claim 2,
   wherein, for the bipolar transistor, the base contacting layer is applied to an upper layer of the collector structure, and
   wherein, for the hetero bipolar transistor, the base contacting layer is applied to an isolator layer which is located on the upper layer of the collector structure.

6. The integrated circuit of claim 1, further comprising a CMOS structure with a first field-effect transistor and a second field-effect transistor.

* * * * *